(12) United States Patent
Nakatsuka et al.

(10) Patent No.: US 12,381,147 B2
(45) Date of Patent: Aug. 5, 2025

(54) CHIP BONDED SEMICONDUCTOR MEMORY DEVICE WITH DIFFERENT CHARGE STORAGE FILMS

(71) Applicant: Kioxia Corporation, Tokyo (JP)

(72) Inventors: Keisuke Nakatsuka, Kobe Hyogo (JP); Yasuhiro Uchiyama, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 234 days.

(21) Appl. No.: 18/181,851

(22) Filed: Mar. 10, 2023

(65) Prior Publication Data

US 2023/0395500 A1 Dec. 7, 2023

(30) Foreign Application Priority Data

Jun. 1, 2022 (JP) ................................. 2022-089484

(51) Int. Cl.
| | |
|---|---|
| *H01L 23/528* | (2006.01) |
| *G11C 16/04* | (2006.01) |
| *G11C 16/10* | (2006.01) |
| *G11C 16/26* | (2006.01) |
| *H01L 23/522* | (2006.01) |
| *H01L 25/18* | (2023.01) |
| *H10B 41/10* | (2023.01) |
| *H10B 41/20* | (2023.01) |
| *H10B 43/10* | (2023.01) |

(Continued)

(52) U.S. Cl.
CPC ...... *H01L 23/5283* (2013.01); *G11C 16/0483* (2013.01); *G11C 16/10* (2013.01); *G11C 16/26* (2013.01); *H01L 23/5226* (2013.01); *H01L 25/18* (2013.01); *H10B 41/10* (2023.02); *H10B 41/20* (2023.02); *H10B 43/10* (2023.02); *H10B 43/20* (2023.02); *H10B 80/00* (2023.02)

(58) Field of Classification Search
CPC . H01L 23/5283; H01L 23/5226; H01L 25/18; H01L 2225/06541; G11C 16/0483; G11C 16/10; G11C 16/26; G11C 16/08; G11C 16/24; H10B 41/10; H10B 41/20; H10B 43/10; H10B 43/20; H10B 80/00; H10B 43/27; H10B 43/50
See application file for complete search history.

(56) References Cited

U.S. PATENT DOCUMENTS

| | | | |
|---|---|---|---|
| 9,514,827 | B1 | 12/2016 | Nam et al. |
| 9,799,404 | B2 | 10/2017 | Nam et al. |
| 9,851,912 | B2 | 12/2017 | Nam et al. |

(Continued)

FOREIGN PATENT DOCUMENTS

| | | |
|---|---|---|
| CN | 106328199 A | 1/2017 |
| CN | 113130504 A | 7/2021 |

(Continued)

*Primary Examiner* — Jerome Leboeuf
(74) *Attorney, Agent, or Firm* — Foley & Lardner LLP

(57) ABSTRACT

According to one embodiment, there is provided a semiconductor memory device including a first chip, a second chip and a third chip. In the first chip, plural first conductive layers are stacked via a first insulating layer. In the second chip, plural second conductive layers are stacked via a second insulating layer. A number of stack layers in the plural first conductive layers and a number of stack layers in the plural second conductive layers are different from each other.

10 Claims, 18 Drawing Sheets

(51) Int. Cl.
*H10B 43/20* (2023.01)
*H10B 80/00* (2023.01)

(56) References Cited

U.S. PATENT DOCUMENTS

| | | |
|---|---|---|
| 10,074,667 B1 | 9/2018 | Higashi et al. |
| 10,297,578 B2 | 5/2019 | Tagami et al. |
| 11,641,738 B2 | 5/2023 | Yang et al. |
| 2011/0249498 A1 | 10/2011 | Tokiwa et al. |
| 2018/0261575 A1* | 9/2018 | Tagami ............... H01L 25/0657 |
| 2020/0058676 A1* | 2/2020 | Ono ..................... H10D 64/037 |
| 2020/0381408 A1* | 12/2020 | Liu ........................ H10B 41/27 |
| 2023/0240068 A1 | 7/2023 | Yang et al. |

FOREIGN PATENT DOCUMENTS

| | | |
|---|---|---|
| JP | 2018-148071 A | 9/2018 |
| JP | 2018-152419 A | 9/2018 |

\* cited by examiner

US 12,381,147 B2

CHIP BONDED SEMICONDUCTOR MEMORY DEVICE WITH DIFFERENT CHARGE STORAGE FILMS

CROSS-REFERENCE TO RELATED APPLICATIONS

This application is based upon and claims the benefit of Japanese Patent Application No. 2022-089484, filed on Jun. 1, 2022; the entire contents of which are incorporated herein by reference.

FIELD

Embodiments described herein relate generally to a semiconductor memory device.

BACKGROUND

A semiconductor memory device having a memory cell array writes data to the memory cell array or reads data from the memory cell array. In the semiconductor memory device, a predetermined function is implemented in write processing and/or read processing.

DETAILED DESCRIPTION

In general, according to one embodiment, there is provided a semiconductor memory device including a first chip, a second chip and a third chip. The second chip is bonded to the first chip. The third chip is bonded to the second chip on a side opposite to the first chip. The first chip includes plural first conductive layers, a first semiconductor film, and a first insulating film. The plural first conductive layers are stacked via a first insulating layer. The first semiconductor film is extending in a stack direction through the plural first conductive layers. The first insulating film is disposed between the plural first conductive layers and the first semiconductor film. The second chip includes plural second conductive layers, a second semiconductor film, and a second insulating film. The plural second conductive layers are stacked via a second insulating layer. The second semiconductor film is extending in the stack direction through the plural second conductive layers. The second insulating film is disposed between the plural second conductive layers and the second semiconductor film. A number of stack layers in the plural first conductive layers and a number of stack layers in the plural second conductive layers are different from each other.

Exemplary embodiments of a semiconductor memory device will be explained below in detail with reference to the accompanying drawings. The present invention is not limited to the following embodiments.

First Embodiment

Figure 1:
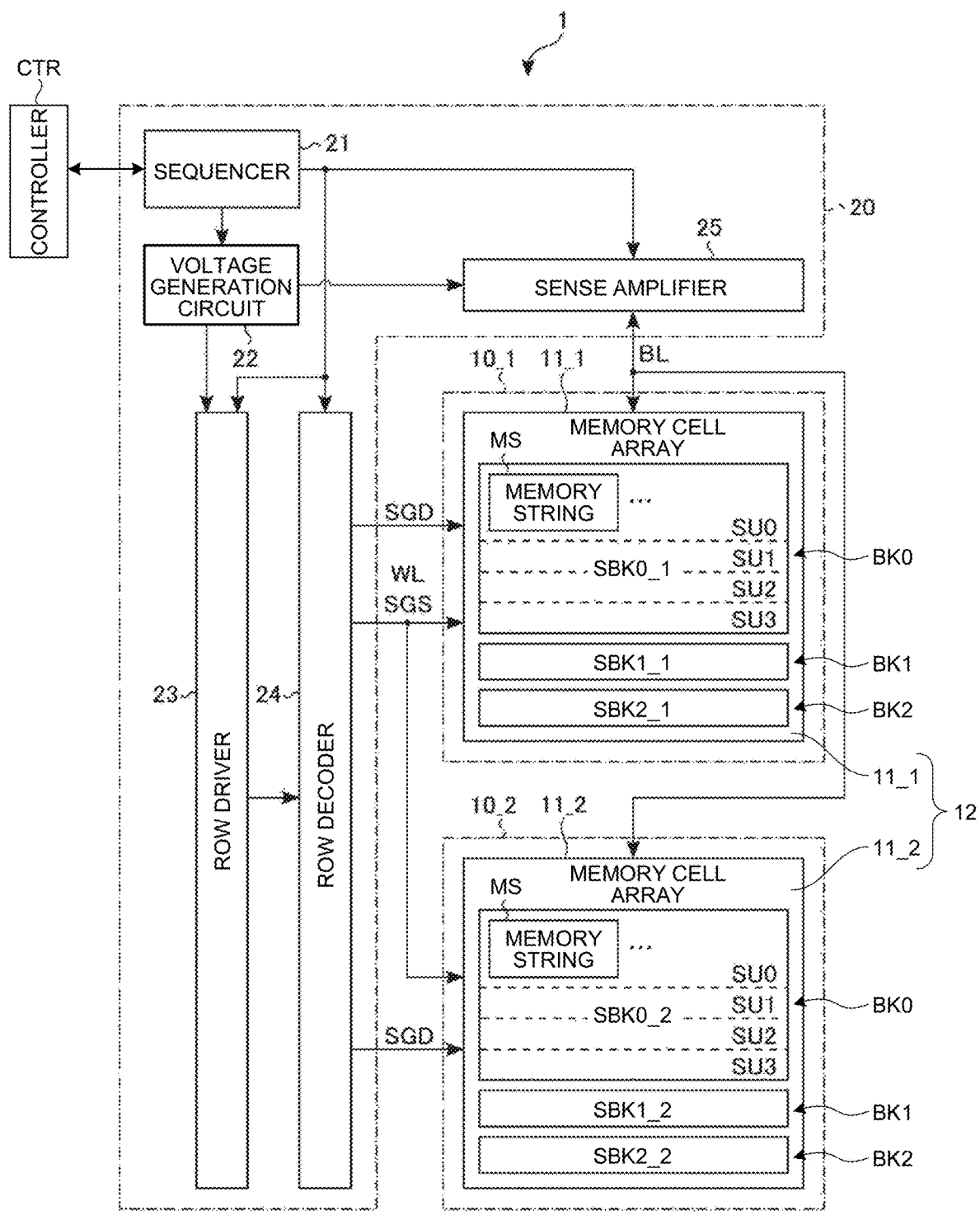
FIG. 1 is a block diagram illustrating a configuration of a semiconductor memory device according to a first embodiment.

The semiconductor memory device according to the first embodiment includes a memory cell array and writes data to the memory cell array or reads data from the memory cell array, and subject to improvements to achieve multifunctional operation of write processing and/or the read processing. For example, a semiconductor memory device 1 can be configured as illustrated in FIG. 1. FIG. 1 is a block diagram illustrating the configuration of the semiconductor memory device 1.

The semiconductor memory device 1 includes plural chips 10_1, 10_2, and 20. Among the plural chips 10_1, 10_2, and 20, the chips 10_1 and 10_2 include memory cell arrays 11_1 and 11_2, respectively, and are also referred to as array chips. The chip 20 includes a circuit for controlling the memory cell arrays 11_1 and 11_2, and is also referred to as a circuit chip.

Note that the chips 10_1 and 10_2 are will be denoted as chips 10 when they are not distinguished from each other. When the memory cell arrays 11_1 and 11_2 will be denoted as the memory cell arrays 11 when they are not distinguished from each other. Although FIG. 1 illustrates a configuration in which the semiconductor memory device 1 includes two chips (array chips) 10_1 and 10_2, the semiconductor memory device 1 may include three or more array chips.

The chip 10_1 includes the memory cell array 11_1. The memory cell array 11_1 has a configuration in which memory cell transistors (hereinafter, simply referred to as memory cells) are three-dimensionally arranged in plurality. The chip 10_2 includes the memory cell array 11_2. In the memory cell array 11_2, memory cells are three-dimensionally arranged in plurality. A memory cell array group 12, including the memory cell array 11_1 and the memory cell array 11_2, includes plural blocks BK. The block BK is a set of plural memory cells to which a word line WL is connected as a common line. Arrangement of the block BK is split into plural chips 10_1 and 10_2. A unit in which the block BK is split for each chip is referred to as a sub-block SBK.

When the memory cell array group 12 includes plural blocks BK0 to BK2, the memory cell array 11_1 includes plural sub-blocks SBK0_1 to SBK2_1, and the memory cell array 11_2 includes plural sub-blocks SBK0_2 to SBK2_2. The memory cells provided in plurality in the sub-block SBK are associated with a row and a column.

Each sub-block SBK includes plural string units SU. The string unit SU is a set of plural memory strings MS sharing the word line WL. FIG. 1 illustrates a configuration in which a sub-block SBK includes four string units SU0 to SU3.

The string unit SU includes the plural memory strings MS. The memory string MS includes a set of plural memory cells connected in series.

It should be noted that, although FIG. 1 illustrates a configuration in which the semiconductor memory device 1 includes two chips (array chips) 10_1 and 10_2, the semiconductor memory device 1 may include three or more array chips. Accordingly, the memory cell array group 12 may include three or more memory cell arrays 11. The number of blocks BK in the memory cell array group 12 and the number of sub-blocks SBK in the memory cell array 11 may be any number. The number of string units SU in the sub-block SBK may be any number.

The chip 20 includes a sequencer 21, a voltage generation circuit 22, a row driver 23, a row decoder 24, and a sense amplifier 25, which are provided as a circuit for controlling the memory cell arrays 11_1 and 11_2.

The sequencer 21 integrally controls individual components of the chip 20. The sequencer 21 is connected to the voltage generation circuit 22, the row driver 23, the row decoder 24, and the sense amplifier 25, individually. The sequencer 21 controls the operation of the semiconductor memory device 1 based on command data received from a controller CTR provided as an external controller.

For example, the sequencer 21 controls a write operation based on a write command. In the control of the write operation, the sequencer 21 writes data from an addressed memory cell in the memory cell array 11 and returns a write completion notification to the controller CTR. The sequencer 21 controls a read operation based on a read command. In the control of the read operation, the sequencer 21 reads data from an addressed memory cell in the memory cell array 11 and returns read data to the controller CTR. The sequencer 21 controls an erase operation based on an erase command. In the control of the erase operation, the sequencer 21 erases data in a designated region in the memory cell array 11 and returns an erase completion notification to the controller CTR.

The voltage generation circuit 22 is connected to the row driver 23 and the sense amplifier 25. Under the control of the sequencer 21, the voltage generation circuit 22 generates a voltage to be used for operations such as the write operation, the read operation, and the erase operation. The voltage generation circuit 22 supplies the generated voltage to the row driver 23 and/or the sense amplifier 25.

The row driver 23 is connected to the row decoder 24. The row driver 23 receives a row address (for example, a page address) from the sequencer 21. The row driver 23 transfers the voltage received from the voltage generation circuit 22 to the row decoder 24 in accordance with the row address.

The row decoder 24 receives a row address (for example, the block address) from the sequencer 21. The row decoder 24 decodes the row address. The row decoder 24 selects the addressed block BK in the memory cell array 11 according to the decoding result.

The row decoder 24 is connected to the memory cell arrays 11_1 and 11_2 via plural word lines WL. The word line WL of the memory cell array 11_1 and the word line WL of the memory cell array 11_2 are connected, as common lines, to the row decoder 24. This makes it possible for the row decoder 24 to drive the word line WL of the memory cell array 11_1 and the word line WL of the memory cell array 11_2 in parallel.

The row decoder 24 is connected to the memory cell arrays 11_1 and 11_2 via plural select gate lines SGS. The select gate line SGS of the memory cell array 11_1 and the select gate line SGS of the memory cell array 11_2 are connected, as common lines, to the row decoder 24. This makes it possible for the row decoder 24 to drive the select gate line SGS of the memory cell array 11_1 and the select gate line SGS of the memory cell array 11_2 in parallel.

The row decoder 24 is connected to the memory cell array 11_1 via plural select gate lines SGD_1, and is connected to the memory cell array 11_2 via plural select gate lines SGD_2. The select gate line SGD_1 of the memory cell array 11_1 and the select gate line SGD_2 of the memory cell array 11_2 individually connected to the row decoder 24. This makes it possible for the row decoder 24 to drive the select gate line SGD_1 of the memory cell array 11_1 and the select gate line SGD_2 of the memory cell array 11_2 independently of each other.

The sense amplifier 25 is connected to the memory cell arrays 11_1 and 11_2 via plural bit lines BL. The sense amplifier 25 supplies a voltage corresponding to the write data to the bit line BL of the memory cell array 11 during the write operation. The sense amplifier 25 senses data read by the bit line BL of the memory cell array 11 during the read operation.

The bit line BL of the memory cell array 11_1 and the bit line BL of the memory cell array 11_2 are connected, as common lines, to the sense amplifier 25. This makes it possible for the sense amplifier 25 to drive or sense the bit line BL of the memory cell array 11_1 and the bit line BL of the memory cell array 11_2 in parallel.

Figure 2:
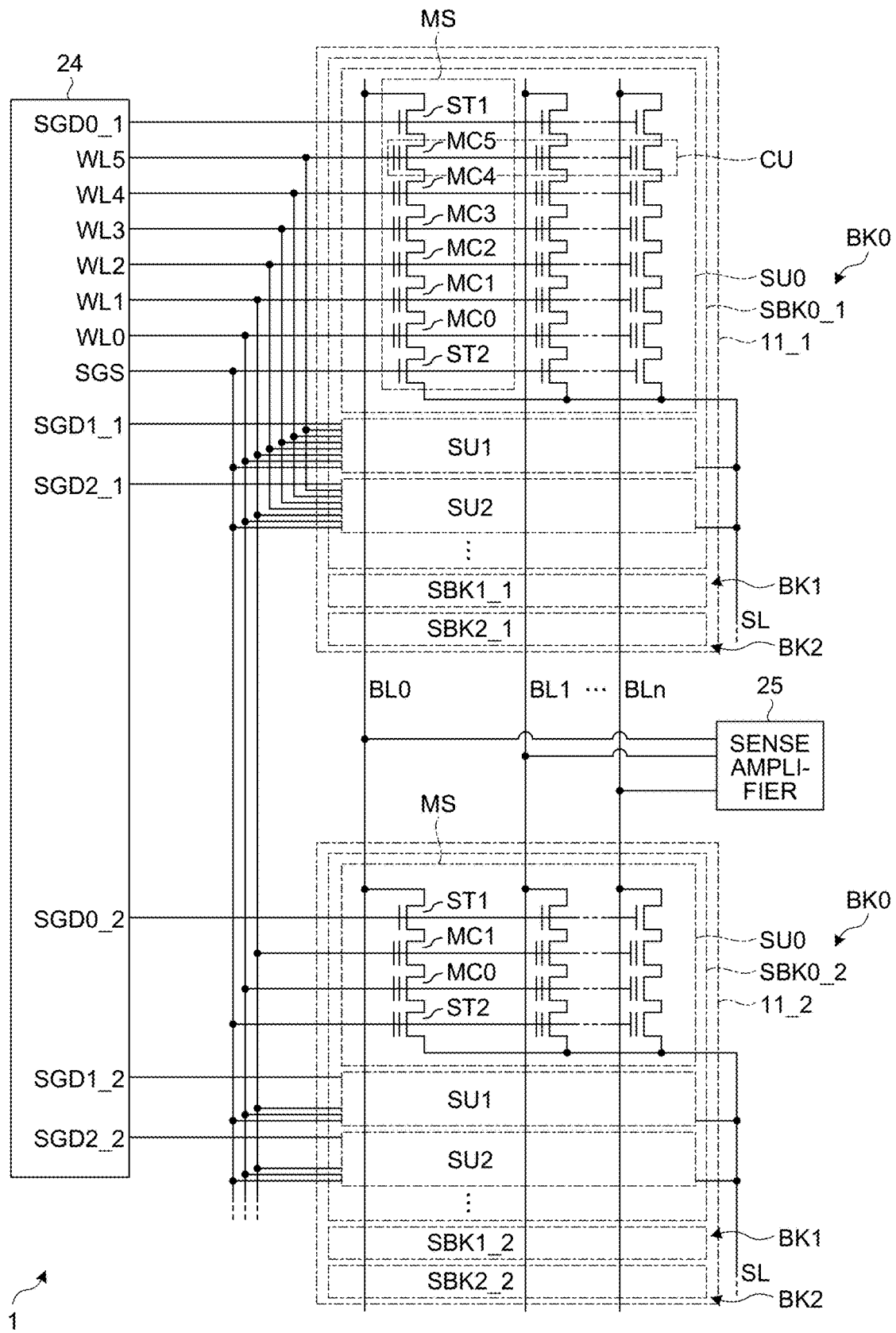
FIG. 2 is a circuit diagram illustrating a configuration of a block in the first embodiment.

Next, a circuit configuration of each of the memory cell arrays 11_1 and 11_2 will be described with reference to FIG. 2. FIG. 2 is a circuit diagram illustrating a configuration of each of the memory cell arrays 11_1 and 11_2.

Each string unit SU of each sub-block SBK of each memory cell array 11 has plural memory strings MS. Each memory string MS includes plural memory cells MC and selection transistors ST1 and ST2. In each memory string MS, plural memory cells MC are connected in series between the selection transistors ST1 and ST2. The selection transistor ST1 has its drain connected to the bit line BL. The selection transistor ST2 has its source connected to a source line SL.

In each string unit SU, the select gate lines SGD and SGS and the word line WL are connected, as common lines, to the plural memory strings MS. For example, the select gate line SGD is connected, as a common line, to the gates of the selection transistors ST1 of the plural memory strings MS.

The word line WL is connected, as a common line, to the gates of the memory cells MC of the plural memory strings MS. The select gate line SGS is connected, as a common line, to the gates of the selection transistors ST2 of the plural memory strings MS.

In one string unit SU, a set of plural memory cells MC connected to one word line WL is referred to as a cell unit CU. For example, when the memory cell MC stores p-bit data (p is an integer of 1 or more), the storage capacity of the cell unit CU is defined as p-page data.

Each memory string MS of the memory cell array 11_1 and each memory string MS of the memory cell array 11_2 are different in the number of word lines WL connected. In the example of FIG. 2, each memory string MS of the memory cell array 11_1 is connected to six word lines WL0 to WL5, while each memory string MS of the memory cell array 11_2 is connected to two word lines WL0 to WL1.

The memory strings MS of the memory cell array 11_1 and the memory strings MS of the memory cell array 11_2 are partially configured such that the word lines WL can be driven in parallel. Among the six word lines WL0 to WL5, two word lines WL0 to WL1 are connected, as common lines, to the gate of the memory cell MC of the memory cell array 11_1 and the gate of the memory cell MC of the memory cell array 11_2. The remaining four word lines WL2 to WL5 are connected to the gate of the memory cell MC of the memory cell array 11_1 without being connected to the gate of the memory cell MC of the memory cell array 11_2.

Each memory string MS of the memory cell array 11_1 and each memory string MS of the memory cell array 11_2 are configured such that the select gate line SGS can be driven in parallel. The select gate line SGS is connected, as a common line, to the gate of the selection transistor ST2 of the memory cell array 11_1 and the gate of the selection transistor ST2 of the memory cell array 11_2.

That is, the row decoder 24 can partially drive the word line WL in parallel in the memory cell array 11_1 and the memory cell array 11_2, and can drive the select gate line SGS in parallel. This makes it possible to reduce the circuit area of the portion of the row decoder 24 that drives the word line WL and the select gate line SGS.

The plural memory strings MS of the memory cell array 11_1, the plural memory strings MS of the memory cell array 11_2, and the plural bit lines BL0 to BLn correspond to each other. Each memory string MS of the memory cell array 11_1 shares the corresponding bit line BL with the memory string MS of the corresponding memory cell array 11_2.

That is, the sense amplifier 25 may drive the bit line BL in parallel in the memory cell array 11_1 and the memory cell array 11_2, enabling sensing of the potential of the bit line BL in parallel. This makes it possible to reduce the circuit area of the portion that drives the bit line BL and the portion that performs sensing in the sense amplifier 25.

Each memory string MS of the memory cell array 11_1 and each memory string MS of the memory cell array 11_2 are configured such that the selection transistors ST1 may be driven independently of each other. The select gate line SGD is individually connected to the memory cell array 11_1 and the memory cell array 11_2. The select gate lines SGD0_1, SGD1_1, and SGD2_1 are connected to the gates of the selection transistors ST1 of the string units SU0, SU1, and SU2 in the memory cell array 11_1, respectively. The select gate lines SGD0_2, SGD1_2, and SGD2_2 are connected to the gates of the selection transistors ST1 of the string units SU0, SU1, and SU2 in the memory cell array 11_2, respectively.

That is, the row decoder 24 may independently drive the select gate lines SGD_1 and SGD_2 in the memory cell array 11_1 and the memory cell array 11_2, and may select and drive at least one of the memory cell array 11_1 or the memory cell array 11_2. With this configuration, the write operation and/or the read operation may be performed independently of each other in the memory cell array 11_1 and the memory cell array 11_2. That is, the memory cell array 11_1 and the memory cell array 11_2 may implement different functions regarding the write operation and/or the read operation, making it possible to utilize the memory cell array 11_1 and the memory cell array 11_2 selectively for each application.

For example, the number of included memory cells MC is different between each memory string MS of the memory cell array 11_1 and each memory string MS of the memory cell array 11_2. Each memory string MS of the memory cell array 11_1 includes six memory cells MC0 to MC5, indicating a relatively high wiring load in the memory string MS. Each memory string MS of the memory cell array 11_2 includes two memory cells MC0 to MC1, indicating a relatively low wiring load in the memory string MS. With this configuration, in the read operation, the memory cell array 11_1 may implement an operation with a relatively small cell current $I_{Cell}$ of the selected memory string MS and with a long period tR with low-speed execution of charge and discharge of the bit line BL, while the memory cell array 11_2 may implement an operation with a relatively large cell current $I_{Cell}$ of the selected memory string MS and with a short period tR with high-speed execution of charge and discharge of the bit line BL. The period tR is a time period from when reception of the read command by the semiconductor memory device 1 to the completion of the read operation by the semiconductor memory device 1, being the time period mainly including the sense operation of the bit line BL by the sense amplifier 25.

Figure 3:
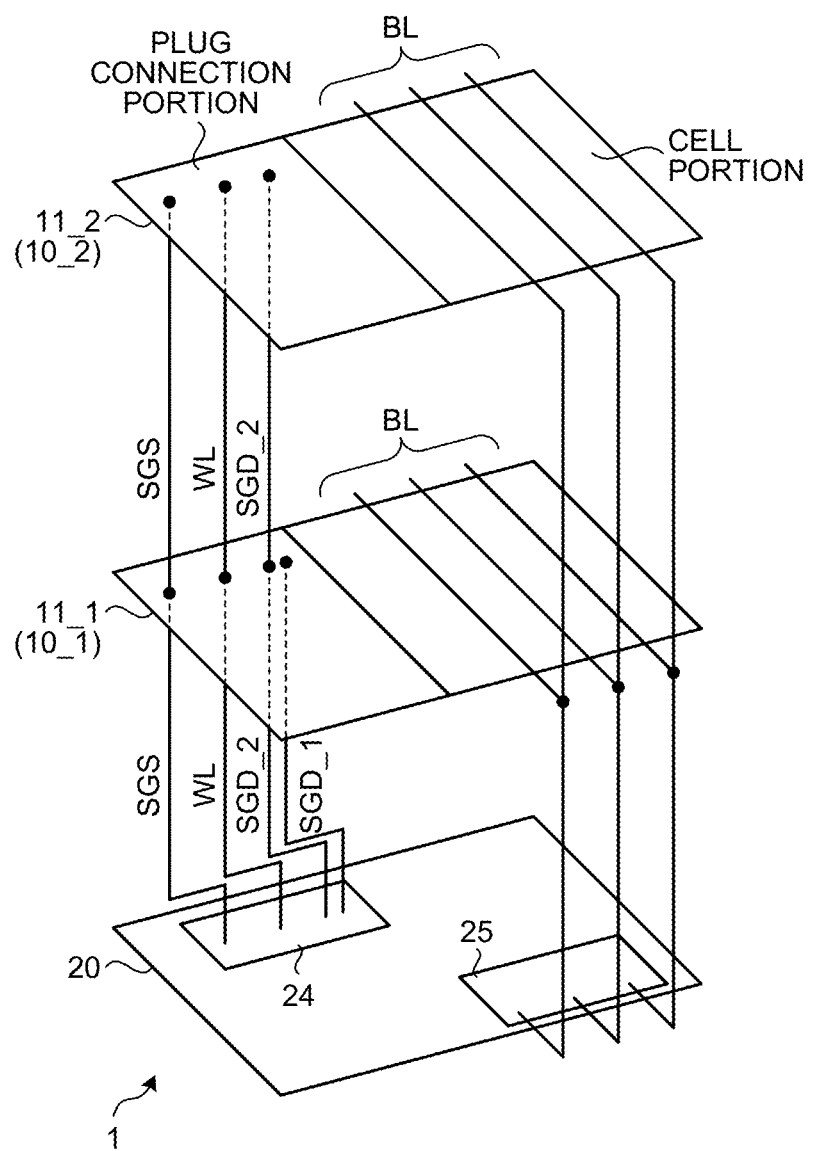
FIG. 3 is a diagram illustrating a connection configuration between chips in the first embodiment.

Next, a connection configuration between chips will be described with reference to FIG. 3. FIG. 3 is a diagram illustrating a connection configuration among the chips 20, 10_1, and 10_2.

A chip (array chip) 20_1 is disposed above the chip (circuit chip) 10. The chip 20_1 may be bonded to the upper surface of the chip 10. A chip (array chip) 10_2 is disposed above the chip 10_1. The chip 10_2 may be bonded to the upper surface of the chip 10_1. The chip 10_2 is bonded to the chip 10_1 on the side opposite to the chip 20. That is, a structure in which the chip 10_1 and the chip 10_2 are sequentially stacked on the chip 20 is formed. This structure is a structure in which the memory cell arrays 11_1 and 11_2 are stacked in plurality, and is also referred to as a multistack array.

In each of the chips 10_1 and 10_2, the memory cell arrays 11_1 and 11_2 each include a cell portion and a plug connection portion. The cell portion is a region in which plural memory cells MC is disposed. The plug connection portion is a region where the select gate line SGS, the word line WL, and the select gate line SGD are drawn out in a planar direction with respect to the cell portion so as to be each connected to a contact plug.

The select gate line SGD_1 of the chip 10_1 and the select gate line SGD_2 of the chip 10_2 are individually connected to the row decoder 24 of the chip 20. The select gate line SGD_1 is connected to the plug connection portion of the memory cell array 11_1. The select gate line SGD_2 passes through the plug connection portion of the memory cell array 11_1 in a state of being insulated from the plug connection portion, so as to be connected to the plug connection portion of the memory cell array 11_2. The select gate line SGD_1 and the select gate line SGD_2 are electrically insulated from each other.

The word line WL of the chip 10_1 and the word line WL of the chip 10_2 are connected, as common lines, to the row decoder 24 of the chip 20. The word line WL is connected to the plug connection portion of the memory cell array 11_1 and the plug connection portion of the memory cell array 11_2.

The select gate line SGS of the chip 10_1 and the select gate line SGS of the chip 10_2 are connected, as common lines, to the row decoder 24 of the chip 20. The select gate line SGS is connected to the plug connection portion of the memory cell array 11_1 and the plug connection portion of the memory cell array 11_2.

The bit line BL of the chip 10_1 and the bit line BL of the chip 10_2 are connected, as common lines, to the sense amplifier 25 of the chip 20. The bit line BL is connected to the cell portion of the memory cell array 11_1 and the cell portion of the memory cell array 11_2.

Figure 4:
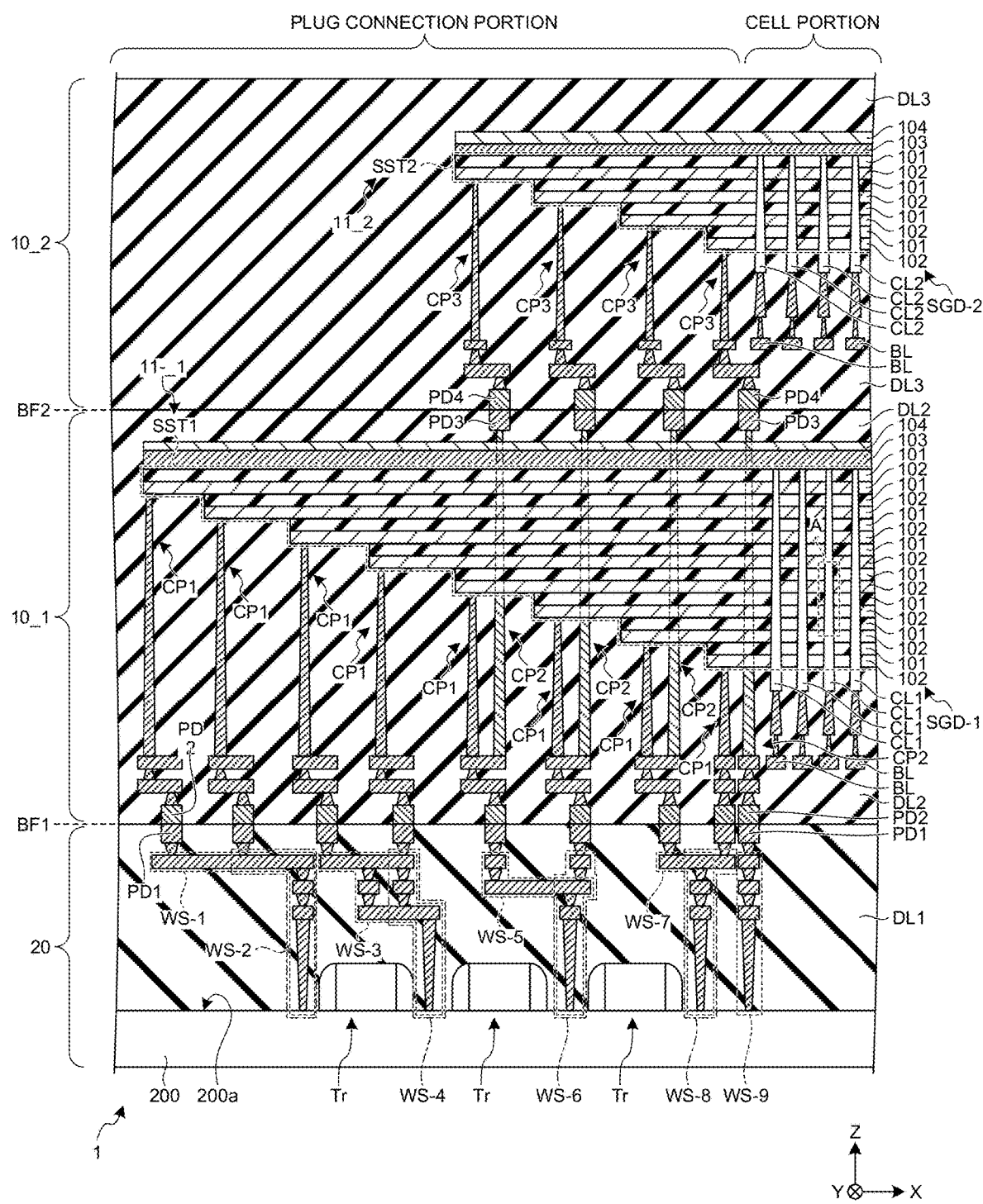
FIG. 4 is a cross-sectional view in the stack direction illustrating the configuration of the semiconductor memory device according to the first embodiment.

Next, a schematic configuration of each of the chips 20, 10_1, and 10_2 in the semiconductor memory device 1 will be described with reference to FIG. 4. FIG. 4 is a cross-sectional view of the configuration of the semiconductor memory device 1 in the stack direction.

The semiconductor memory device 1 has a configuration in which plural chips 20, 10_1, and 10_2 is stacked. The chip 10_1 is disposed on the +Z side of the chip 20. The chip 10_2 is disposed on the +Z side of the chip 10_1. That is, the chips 10_1 and 10_2 are sequentially stacked on the +Z side of the chip 20. The structure in which the chips 10_1 and 10_2 are sequentially bonded to the +Z side of the chip 20 includes a stack in which the memory cell arrays 11_1 and 11_2 are sequentially stacked, and is also referred to as a multi-stack array.

Note that the number of chips (array chips) 10 stacked in the multi-stack array is not limited to two, and may be three or more.

The chip 10_1 is bonded to the +Z-side surface of the chip 20. The chip 10_1 may be bonded by direct bonding. The chip 20 has, on its +Z side, an insulating film (for example, an oxide film) DL1 and an electrode PD1. The chip 10_1 has, on its −Z side, an insulating film (for example, an oxide film) DL2 and an electrode PD2. On a bonding surface BF1 of the chips 20 and 10_1, the insulating film DL1 of the chip 20 and the insulating film DL2 of the chip 10_1 are bonded to each other, and the electrode PD1 of the chip 20 and the electrode PD2 of the chip 10_1 are bonded to each other.

The chip 10_2 is bonded to the +Z-side surface of the chip 10_1. The chip 10_2 is bonded to the chip 10_1 on the side opposite to the chip 20. The chip 10_2 may be bonded by direct bonding. The chip 10_1 has, on its +Z side, an insulating film (for example, an oxide film) DL2 and an electrode PD3. The chip 10_2 has, on its −Z side, an insulating film (for example, an oxide film) DL3 and an electrode PD4. On a bonding surface BF2 of the chips 10_1 and 10_2, the insulating film DL2 of the chip 10_1 and the insulating film DL3 of the chip 10_2 are bonded to each other, and the electrode PD3 of the chip 10_1 and the electrode PD4 of the chip 10_2 are bonded to each other.

The chip 20 includes a substrate 4, a transistor Tr, an electrode PD1, wiring structures WS-1 to WS-9, and an insulating film DL1. The substrate 4 is disposed on the −Z side of the chip 20 and extends in a plate-like shape in the XY direction. The substrate 4 may be formed of a material containing a semiconductor (for example, silicon) as a main component. The substrate 4 has a +Z-side surface 4a. The transistor Tr functions as a circuit element of a circuit (sequencer 21, voltage generation circuit 22, row driver 23, row decoder 24, sense amplifier 25, and the like) for controlling the memory cell array 11. The transistor Tr includes a gate electrode disposed as a conductive film on a surface 200a of a substrate 200, a source electrode/drain electrode disposed as a semiconductor region in the vicinity of the surface 200a in the substrate 200, and the like. As mentioned before, the electrode PD1 is disposed such that the surface thereof is exposed on the bonding surface BF1 of the chips 20 and 10_1. Each of the wiring structures WS-1 to WS-9 extends mainly in the Z direction and connects the gate electrode, the source electrode, the drain electrode, and the like of the transistor Tr to the electrode PD1.

The chip 10_1 includes a stack structure SST1, a conductive layer 103, a conductive layer 104, plural columnar bodies CL1, plural plugs CP1, plural plugs CP2, plural conductive films BL, an electrode PD2, an electrode PD3, and an insulating film DL2. In the stack structure SST1, plural conductive layers 102 is stacked in the Z direction with an insulating layer 101 interposed therebetween. In the stack structure SST1, the conductive layer 102 and the insulating layer 101 are alternately stacked plural times. The thickness of the conductive layer 102 in the Z direction and the thickness of the insulating layer 101 in the Z direction may be substantially equal to each other. The plural conductive layers 102 function, in order from the −Z side to the +Z side, as the select gate line SGD, the word line WL5, the word line WL4, the word line WL3, the word line WL2, the word line WL1, the word line WL0, and the select gate line SGS.

Each conductive layer 102 extends in a plate-like shape in the XY direction. Each columnar body CL1 extends in the Z direction through the plural conductive layers 102. Each columnar body CL1 may penetrate the stack structure SST1 in the Z direction. Each columnar body CL1 extends in a columnar shape in the Z direction. Each columnar body CL1 includes a semiconductor film CH (refer to FIGS. 5A and 5B) functioning as a channel region. The semiconductor film CH extends in a columnar manner (for example, in a columnar shape or a tubular shape) having an axis in the Z direction. The plural memory cells MC are formed at plural intersection positions where the plural conductive layers 102 and the plural columnar bodies CL1 intersect, that is, at plural intersection positions where the plural conductive layers 102 and the plural semiconductor films CH intersect.

Figure 5A:
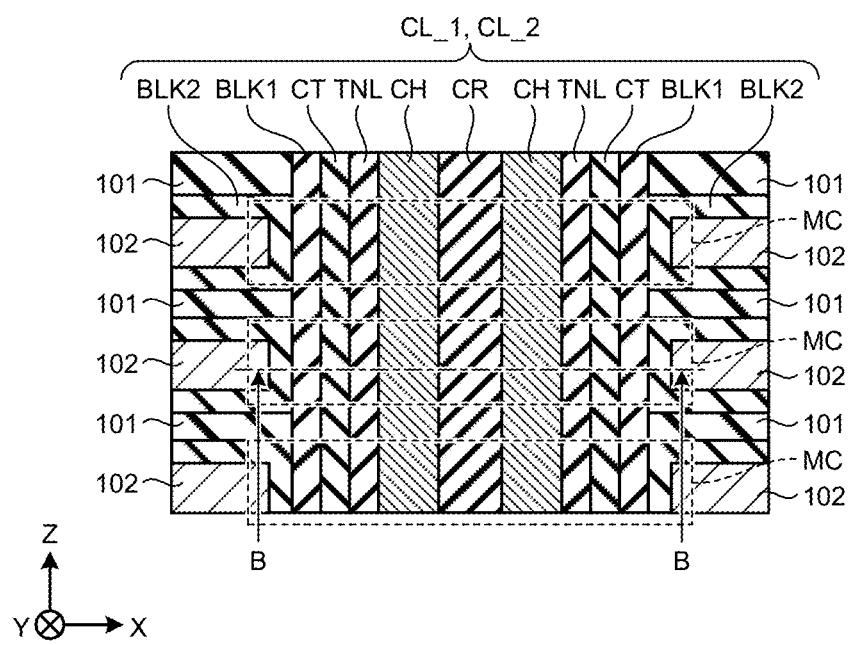
FIGS. 5A and 5B are cross-sectional views in the stack direction and the planar direction illustrating a configuration of a memory cell according to the first embodiment.
Figure 5B:
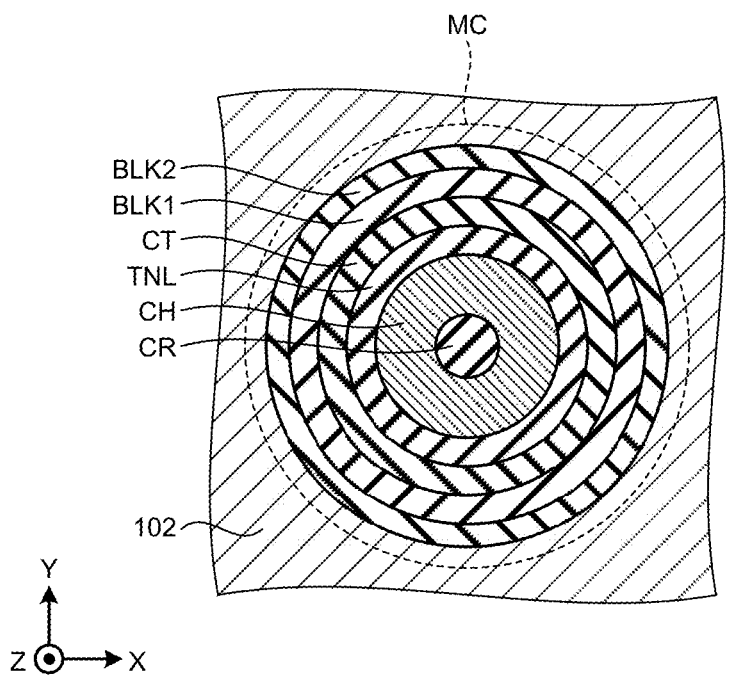

As illustrated in FIGS. 5A and 5B, each columnar body CL1 includes an insulating film CR, a semiconductor film CH, an insulating film TNL, a charge storage film CT, and an insulating film BLK1. FIG. 5A is an XZ cross-sectional view illustrating the configuration of the memory cell MC, being an enlarged cross-sectional view of portion A in FIG. 4. FIG. 5B is an XY cross-sectional view illustrating the configuration of the memory cell MC, illustrating a cross section of FIG. 5A taken along line B-B. The insulating film CR extends in the Z direction and forms a columnar shape having an axis in the Z direction. The insulating film CR may be formed of an insulator such as silicon oxide. The semiconductor film CH extends in the Z direction so as to cover the insulating film CR from the outside in the XY direction, and has a tubular shape having an axis in the Z direction. The semiconductor film CH may be formed of a semiconductor such as polysilicon. The insulating film TNL extends in the Z direction so as to cover the semiconductor film CH from the outside in the XY direction, and has a tubular shape having an axis in the Z direction. The insulating film TNL may be formed of an insulator such as silicon oxide. The charge storage film CT extends in the Z direction so as to cover the insulating film TNL from the outside in the XY direction, and has a tubular shape having an axis in the Z direction. The charge storage film CT may be formed of an insulator such as silicon nitride. The insulating film BLK1 extends in the Z direction so as to cover the charge storage film CT from the outside in the XY direction, and has a tubular shape having an axis in the Z direction. The insulating film BLK1 may be formed of an insulator such as silicon oxide. The insulating film BLK2 covers the insulating film BLK1 from the outside in the XY direction, extends so as to cover the +Z-side surface, the columnar body CL-side surface, and the −Z-side surface of the conductive layer 102, and forms a substantially hollow disc shape having an axis in the Z direction. The insulating film BLK2 may be formed of an insulator such as aluminum oxide. Portions surrounded by a dotted line in FIGS. 5A and 5B function as the memory cells MC.

As illustrated in FIG. 4, the semiconductor film CH in the columnar body CL1 is connected, at its +Z-side end, to the conductive layer 103, while being connected, at its −Z-side end, to the conductive film BL via a plug. The conductive film BL functions as a bit line BL (refer to FIG. 2). The conductive layer 103 has its +Z side covered with the conductive layer 104. The conductive layers 103 and 104 function as source lines SL (refer to FIG. 2). The semiconductor film CH functions as a channel region in the memory string MS (refer to FIG. 2).

The conductive layers 102 may have substantially equal widths in the Y direction. The width of the plural conductive layers 102 in the X direction gradually increases from the −Z side to the +Z side. The conductive layers 102 provided in plurality are configured such that the X direction end is gradually positioned toward the outer side from the −Z side to the +Z side. This leads to formation of a staircase structure in which the select gate line SGD, the word line WL5, the word line WL4, the word line WL3, the word line WL2, the word line WL1, the word line WL0, and the select gate line SGS are drawn out in a staircase shape in order from the −Z side to the +Z side at the plug connection portion in the memory cell array 11_1.

The plural plugs CP1 correspond to the plural conductive layers 102. Each plug CP1 is disposed between the electrode PD1 and the corresponding conductive layer 102 in the Z direction, specifically having its −Z side end electrically connected to the electrode PD2, extending in the Z direction, and having its +Z side end electrically connected to the corresponding conductive layer 102. This allows the plug CP1 to electrically connect the electrode PD2 and the corresponding conductive layer 102. Each conductive layer 102 may be connected to the transistor Tr of the chip 20 via the plug CP1, the electrode PD2, the electrode PD1, and the wiring structure WS.

The plural plugs CP2 correspond to the plural electrodes PD2 and correspond to the plural electrodes PD3. Each plug CP2 is disposed between the corresponding electrode PD2 and the corresponding electrode PD3 in the Z direction, specifically having its −Z side end electrically connected to the electrode PD2, extending in the Z direction to penetrate the plural conductive layers 102, and having its +Z side end electrically connected to the corresponding electrode PD3. Each plug CP2 penetrates the conductive layer 102 in a state where the outer surface thereof is covered with an insulating film and insulated from the conductive layer 102. This allows the plug CP2 to electrically connect the corresponding electrode PD2 and the corresponding electrode PD3.

The conductive films BL provided in plurality are disposed on the −Z side of the stack structure SST1. The conductive films BL provided in plurality are disposed in the X direction. Each of the conductive films BL extends in the Y direction. The plural conductive films BL correspond to the plural columnar bodies CL1. Each conductive film BL is electrically connected to the −Z side end of the corresponding columnar body CL1 and functions as the bit line BL. The conductive film BL is electrically connected to the electrode PD2. This makes it possible for the bit line BL to be connected to the transistor Tr of the chip 10 via the electrode PD2, the electrode PD1, and the wiring structure WS.

As mentioned before, the electrode PD2 is disposed such that the surface thereof is exposed on the bonding surface BF1 of the chips 20 and 10_1. As mentioned before, the electrode PD3 is disposed such that the surface thereof is exposed on the bonding surface BF2 of the chips 10_1 and 10_2.

The chip 10_2 includes the stack structure SST2, the conductive layer 103, the conductive layer 104, plural columnar bodies CL2, plural plugs CP3, the plural conductive films BL, the electrode PD4, and the insulating film DL2. In the stack structure SST2, the plural conductive layers 102 is stacked in the Z direction via the insulating layer 101. In the stack structure SST1, the conductive layer 102 and the insulating layer 101 are alternately stacked plural times. The thickness of the conductive layer 102 in the Z direction and the thickness of the insulating layer 101 in the Z direction may be substantially equal to each other. The conductive layers 102 provided in plurality sequentially function, in order from the −Z side to the +Z side, as the select gate line SGD, the word line WL1, the word line WL0, and the select gate line SGS.

Each conductive layer 102 extends in a plate-like shape in the XY direction. Each columnar body CL2 extends in the Z direction through the plural conductive layers 102. Each columnar body CL2 may penetrate the stack structure SST2 in the Z direction. Each columnar body CL2 extends in a columnar shape in the Z direction. Each columnar body CL2 includes a semiconductor film CH (refer to FIGS. 5A and 5B) functioning as a channel region. The semiconductor film CH extends in a columnar manner (for example, in a columnar shape or a tubular shape) having an axis in the Z direction. The plural memory cells MC is formed at plural intersection positions where the plural conductive layers 102 and the plural columnar bodies CL2 intersect, that is, at plural intersection positions where the plural conductive layers 102 and the plural semiconductor films CH intersect.

As illustrated in FIGS. 5A and 5B, each columnar body CL2 includes an insulating film CR, a semiconductor film CH, an insulating film TNL, a charge storage film CT, and an insulating film BLK1. The insulating film CR extends in the Z direction and forms a columnar shape having an axis in the Z direction. The insulating film CR may be formed of an insulator such as silicon oxide. The semiconductor film CH extends in the Z direction so as to cover the insulating film CR from the outside in the XY direction, and has a tubular shape having an axis in the Z direction. The semiconductor film CH may be formed of a semiconductor such as polysilicon. The insulating film TNL extends in the Z direction so as to cover the semiconductor film CH from the outside in the XY direction, and has a tubular shape having an axis in the Z direction. The insulating film TNL may be formed of an insulator such as silicon oxide. The charge storage film CT extends in the Z direction so as to cover the insulating film TNL from the outside in the XY direction, and has a tubular shape having an axis in the Z direction. The charge storage film CT may be formed of an insulator such as silicon nitride. The insulating film BLK1 extends in the Z direction so as to cover the charge storage film CT from the outside in the XY direction, and has a tubular shape having an axis in the Z direction. The insulating film BLK1 may be formed of an insulator such as silicon oxide. The insulating film BLK2 covers the insulating film BLK1 from the outside in the XY direction, extends so as to cover the +Z-side surface, the columnar body CL-side surface, and the −Z-side surface of the conductive layer 102, and forms a substantially hollow disc shape having an axis in the Z direction. The insulating film BLK2 may be formed of an insulator such as aluminum oxide. Portions surrounded by a dotted line in FIGS. 5A and 5B function as the memory cells MC.

As illustrated in FIG. 4, the semiconductor film CH in the columnar body CL2 is connected, at the +Z-side end, to the conductive layer 103, and is connected, at the −Z-side end, to the conductive film BL via a plug. The conductive film BL functions as a bit line BL (refer to FIG. 2). The conductive layer 103 has its +Z side covered with the conductive layer 104. The conductive layers 103 and 104 function as source lines SL (refer to FIG. 2). The semiconductor film CH functions as a channel region in the memory string MS (refer to FIG. 2).

The conductive layers 102 may have substantially equal widths in the Y direction. The width of the plural conductive layers 102 in the X direction gradually increases from the −Z side to the +Z side. The conductive layers 102 provided in plurality are configured such that the X direction end is gradually positioned toward the outer side from the −Z side to the +Z side. This leads to formation of a staircase structure in which the select gate line SGD, the word line WL5, the word line WL4, the word line WL3, the word line WL2, the word line WL1, the word line WL0, and the select gate line SGS are drawn out in a staircase shape in order from the −Z side to the +Z side, at the plug connection portion in the memory cell array 11_2.

The plural plugs CP3 correspond to the plural conductive layers 102. Each plug CP3 is disposed between the electrode PD4 and the corresponding conductive layer 102 in the Z direction, specifically having its −Z side end electrically connected to the electrode PD4, extending in the Z direction, and having its +Z side end electrically connected to the corresponding conductive layer 102. This allows the plug CP3 to electrically connect the electrode PD4 and the corresponding conductive layer 102. Each conductive layer 102 may be connected to the transistor Tr of the chip 20 via the plug CP3, the electrode PD4, the electrode PD3, the plug CP2, the electrode PD2, the electrode PD1, and the wiring structure WS.

The plural conductive films BL are disposed on the −Z side of the stack structure SST2. The conductive films BL provided in plurality are disposed in the X direction. Each of the conductive films BL extends in the Y direction. The plural conductive films BL correspond to the plural columnar bodies CL2. Each conductive film BL is electrically connected to the −Z-side end of the corresponding columnar body CL2 and functions as the bit line BL. The conductive film BL is electrically connected to the electrode PD4. This allows the bit line BL to be connected to the transistor Tr of the chip 10 via the plug (not illustrated), the electrode PD4, the electrode PD3, the plug (not illustrated), the electrode PD2, the electrode PD1, and the wiring structure WS.

As mentioned before, the electrode PD4 is disposed such that the surface thereof is exposed on the bonding surface BF2 of the chips 10_1 and 10_2.

Comparing the chip 10_1 and the chip 10_2, a line extending from the select gate line SGD_1 to the chip 20 and a line extending from the select gate line SGD_2 to the chip 20 are insulated from each other. A connection configuration from the most −Z-side conductive layer 102 of the chip 10_1 to the transistor Tr of the chip 20 (plug CP1→electrode PD2→electrode PD1→wiring structure WS-8) and a connection configuration from the most −Z-side conductive layer 102 of the chip 10_2 to the transistor Tr of the chip 20 (plug CP3→electrode PD4→electrode PD3→plug CP2→electrode PD2→electrode PD1→wiring structure WS-9) are insulated from each other. With this configuration, the write operation and/or the read operation may be performed independently of each other in the memory cell array 11_1 and the memory cell array 11_2.

In addition, the number of stack layers in the conductive layers 102 in the stack structure SST1 is different from the number of stack layers in the conductive layers 102 in the stack structure SST2. The stack pitch of the conductive layers 102 in the stack structure SST1 and the stack pitch of the conductive layers 102 in the stack structure SST2 may be substantially equal to each other. Here, the stack pitch of the conductive layer 102 is substantially equal to the sum of the film thickness of the conductive layer 102 and the film thickness of the insulating layer 101. Accordingly, the semiconductor film CH of the columnar body CL1 penetrating the stack structure SST1 and the semiconductor film CH of the columnar body CL2 penetrating the stack structure SST2 have different lengths in the Z direction. This leads to a difference in a wiring load ($=\sqrt{\{(\text{wiring resistance})\times(\text{wiring capacitance})\}}$) in each memory string MS of the memory cell array 11_1 and the wiring load of each memory string MS of the memory cell array 11_2, resulting in a difference in periods tR in the read operation between the memory cell array 11_1 and the memory cell array 11_2. That is, the memory cell array 11_1 and the memory cell array 11_2 may implement different functions regarding the read operation, making it possible to utilize the memory cell array 11_1 and the memory cell array 11_2 selectively for each application.

For example, the number of stack layers in the conductive layers 102 in the stack structure SST1 is larger than the number of stack layers in the conductive layers 102 in the stack structure SST2. In the example of FIG. 4, the number of stack layers in the conductive layers 102 in the stack structure SST1 is eight, and the number of stack layers in the conductive layers 102 in the stack structure SST2 is four, but is not particularly limited. For example, the number of stack layers in the conductive layers 102 in the stack structure SST2 may be ¾ or less of the number of stack layers in the conductive layers 102 in the stack structure SST1. For example, the number of stack layers in the conductive layers 102 in the stack structure SST2 may be ½ or less of the number of stack layers in the conductive layers 102 in the stack structure SST1. Accordingly, the length of the semiconductor film CH in the Z direction in the columnar body CL1 penetrating the stack structure SST1 is longer than the length of the semiconductor film CH in the Z direction in the columnar body CL2 penetrating the stack structure SST2. This makes the wiring load of each memory string MS of the memory cell array 11_1 higher than the wiring load of each memory string MS of the memory cell array 11_2. With this configuration, in the read operation, the memory cell array 11_1 may implement an operation with a relatively small cell current $I_{Cell}$ of the selected memory string MS and with a long period tR with low-speed execution of charge and discharge of the bit line BL, while the memory cell array 11_2 may implement an operation with a relatively large cell current $I_{Cell}$ of the selected memory string MS and with a short period tR with high-speed execution of charge and discharge of the bit line BL.

Here, the memory cell array 11_1 is characterized in that the number of stack layers in the conductive layers 102 in the stack structure SST1 is large and the manufacturing cost is high, while the memory cell array 11_2 is characterized in that the number of stack layers in the conductive layers 102 in the stack structure SST2 is small and the manufacturing cost is low. That is, when there is a demand for a high-speed read operation even with a high cost, the read operation may be performed using the memory cell array 11_1, and when there is a demand for a low-cost read operation even with a low speed, the read operation may be performed using the memory cell array 11_2.

Note that among the plural wiring structures WS-1 to WS-9, the wiring structures WS-1 to WS-4 and WS-8 are electrically connected to the conductive layers 102 of the chip 10_1 and are not electrically connected to the conductive layers 102 of the chip 10_2. The wiring structures WS-5 to WS-7 are electrically connected to both the conductive layer 102 of the chip 10_1 and the conductive layer 102 of the chip 10_2. The wiring structure WS-9 is not electrically connected to the conductive layers 102 of the chip 10_1, but is electrically connected to the conductive layers 102 of the chip 10_2. This structure enables formation of a structure suitable for making the number of stack layers in the conductive layers 102 in the stack structure SST1 larger than the number of stack layers in the conductive layers 102 in the stack structure SST2.

Alternatively, although not illustrated, the number of stack layers in the conductive layers 102 in the stack structure SST1 may be smaller than the number of stack layers in the conductive layers 102 in the stack structure SST2. Accordingly, the length of the semiconductor film CH in the Z direction in the columnar body CL1 penetrating the stack structure SST1 is shorter than the length of the semiconductor film CH in the Z direction in the columnar body CL2 penetrating the stack structure SST2. This makes the wiring load of each memory string MS of the memory cell array 11_1 lower than the wiring load of each memory string MS of the memory cell array 11_2. With this configuration, in the read operation, the memory cell array 11_1 may implement an operation with a relatively large cell current $I_{Cell}$ of the selected memory string MS and with a short period tR with high-speed execution of charge and discharge of the bit line BL, while the memory cell array 11_2 may implement an operation with a relatively small cell current $I_{Cell}$ of the selected memory string MS and with a long period tR with low-speed execution of charge and discharge of the bit line BL.

Figure 6:
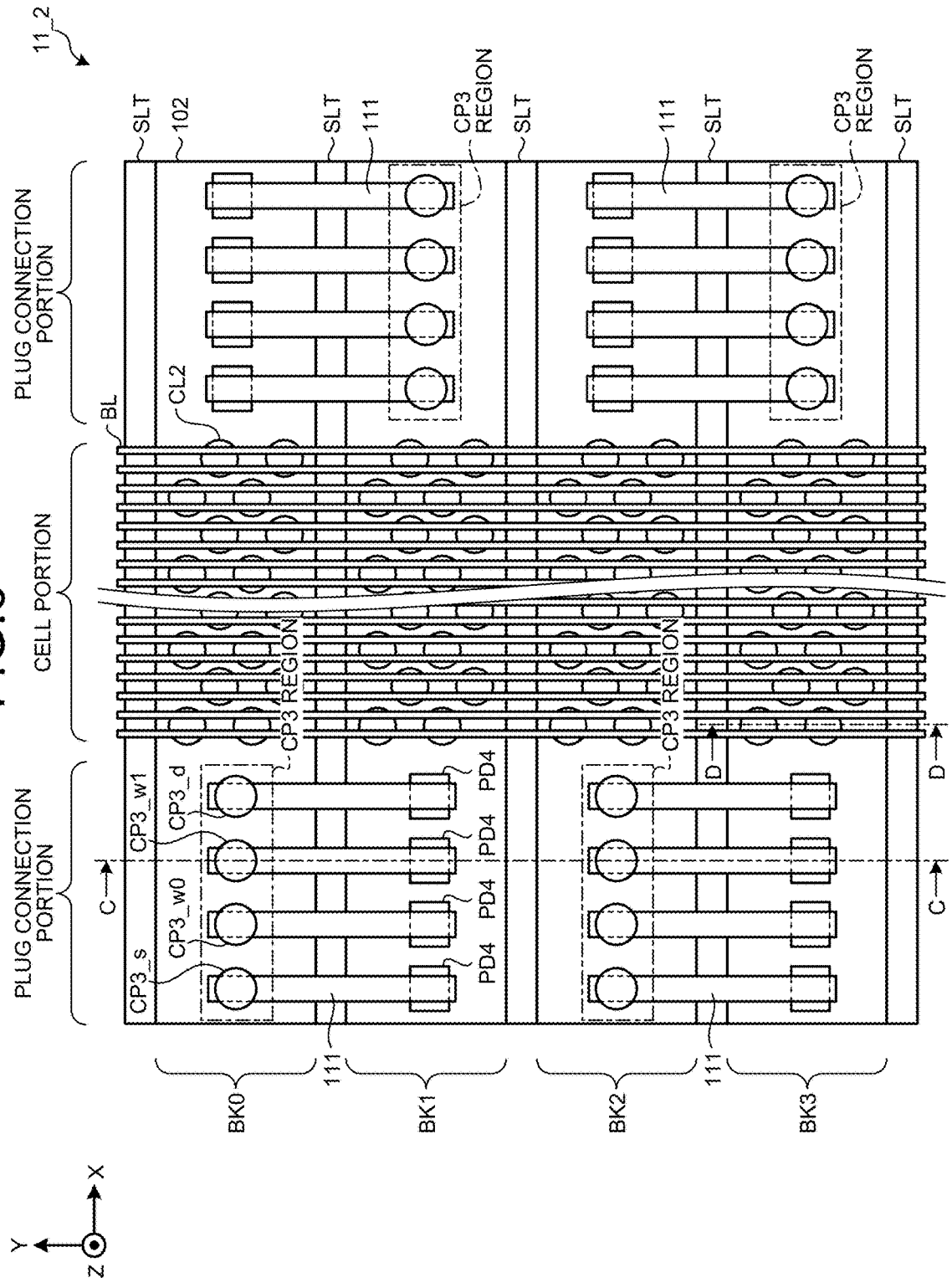
FIG. 6 is a plan view illustrating a configuration of a memory cell array according to the first embodiment.

Next, a planar configuration of the memory cell array 11_2 will be described with reference to FIG. 6. FIG. 6 is an XY plan view illustrating a configuration of the memory cell array 11_2.

In the memory cell array 11_2, blocks BK0, BK1, BK2, and BK3 are arranged in this order from the +Y side to the −Y side. In each block BK, plural conductive layers 102 is stacked apart from each other in the Z direction. For example, in each block BK, four conductive layers 102 functioning as the select gate line SGS, the word lines WL0 to WL1, and the select gate line SGD are stacked. There is provided a slit SLT extending in the XZ direction on a side surface in the Y direction of each block BK. The slit SLT electrically isolates the plural blocks BK from each other.

The block BK includes a cell portion and a plug connection portion.

There is provided plural columnar bodies CL disposed in the cell portion. Each columnar body CL extends in the Z direction. The columnar body CL corresponds to the memory string MS (refer to FIG. 2). The plural columnar bodies CL is two-dimensionally arranged in the XY direction. In the example of FIG. 6, the columnar bodies CL are arranged in four rows in the X direction. The number of columns in the arrangement of the columnar bodies CL may be three or less, or may be five or more. The plural columnar bodies CL may be disposed in a staggered arrangement or may be disposed in a lattice arrangement.

On the +Z side of the columnar body CL, plural bit lines BL is each arranged in the X direction and extends in the Y direction. The columnar body CL is connected to one of the bit lines BL.

The plug connection portions are disposed on both sides of the cell portion in the X direction. The plug connection portion includes a CP3 region.

There is provided plural plugs CP3 in the CP3 region. Each plug CP3 extends in the Z direction. The plug CP3 is electrically connected to one conductive layer 102 and is not electrically connected to other conductive layers 102. Hereinafter, when the plugs CP3 connected to the conductive layer 102 functioning as the word lines WL0 and WL1 are specified, the plugs CP3 will be denoted as plugs CP3_w0 and CP3_w1, respectively. When the plugs CP3 connected to the conductive layer 102 functioning as the select gate lines SGD and SGS are specified, the plugs CP3 will be denoted as plugs CP3_d and CP3_s, respectively. In the example of FIG. 6, the plugs CP3_s, CP3_w0, CP3_w1, and CP3_d are disposed in this order from the end in the X direction of the memory cell array 11_2 toward the cell portion. The plugs CP3 may be disposed in one row, or may be disposed in two rows in a staggered arrangement.

On the −Z side of the plug CP3, a conductive layer 111 is disposed. The conductive layer 111 is electrically connected to the −Z-side end of the plug CP3 and extends in the +Y direction or the −Y direction from the connection position with the plug CP3 to the adjacent block BK. For example, the conductive layer 111 extends in the −Y direction from the connection position with the plug CP3 in the block BK0 to the connection position with the electrode PD4 in the block BK1. In the adjacent block BK, the electrode PD4 is disposed at a position corresponding to the plug CP3 on the −Z side of the conductive layer 111, and an insulating layer 112 is disposed at other positions. The electrode PD4 has its −Z-side surface exposed to the bonding surface BF2. The insulating layer 112 has its −Z-side surface exposed to the bonding surface BF2.

Figure 7:
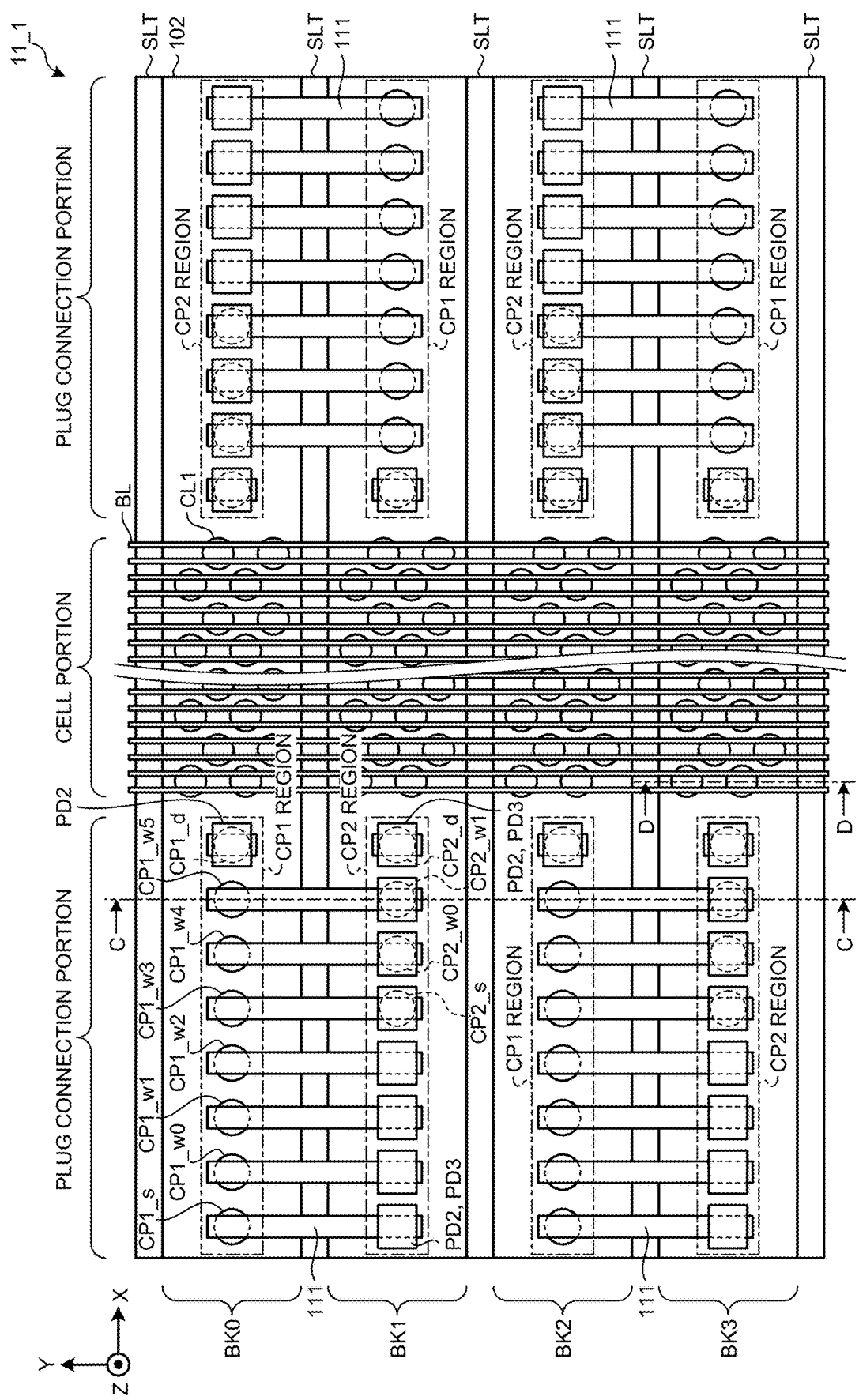
FIG. 7 is a plan view illustrating a configuration of the memory cell array according to the first embodiment.

Next, a planar configuration of the memory cell array 11_1 will be described with reference to FIG. 7. FIG. 7 is an XY plan view illustrating a configuration of the memory cell array 11_1.

The memory cell array 11_1 is similar to the memory cell array 11_2 in that each block BK includes a cell portion and a plug connection portion. In addition, it is similar to the memory cell array 11_2 in the configuration of the cell portion.

The plug connection portions are disposed on both sides of the cell portion in the X direction. The plug connection portion includes a CP1 region and a CP2 region.

The CP1 region includes plural plugs CP1. Each of the plugs CP1 extends in the Z direction. The plug CP1 is electrically connected to one conductive layer 102 and is not electrically connected to the other conductive layer 102. Hereinafter, when the plugs CP1 connected to the conductive layer 102 functioning as the word lines WL0 to WL5 are specified, the plugs CP1 will be denoted as plugs CP1_$w$0 and CP1_$w$5, respectively. When the plugs CP1 connected to the conductive layer 102 functioning as the select gate lines SGD and SGS are specified, the plugs CP1 will be denoted as plugs CP1_$d$ and CP1_$s$, respectively. In the example of FIG. 7, the plugs CP1_$s$, CP1_$w$0, CP1_$w$1, CP1_$w$2, CP1_$w$3, CP1_$w$4, CP1_$w$5, and CP1_$d$ are disposed in this order from the end in the X direction of the memory cell array 11_1 toward the cell portion. The plugs CP1 may be disposed in one row, or may be disposed in two rows in a staggered arrangement.

On the −Z side of the plug CP1_$d$, the conductive layer 111 is disposed. The conductive layer 111 is electrically connected to the −Z-side end of the plug CP1 and is connected to the electrode PD2 at a connection position with the plug CP1. The electrode PD2 has its −Z-side surface exposed to the bonding surface BF1. The insulating layer 112 has its −Z-side surface exposed to the bonding surface BF1.

The conductive layer 111 is disposed on the −Z side of the other plugs CP1_$s$ to CP1_$w$5. The conductive layer 111 is electrically connected to the −Z-side end of the plug CP1 and extends in the +Y direction or the −Y direction from the connection position with the plug CP1 to the adjacent block BK. For example, the conductive layer 111 extends in the −Y direction from the connection position with the plug CP1 in the block BK0 to the connection position with the electrode PD4 in the block BK1. In the adjacent block BK, the electrode PD2 is disposed at a position corresponding to the plug CP2 on the −Z side of the conductive layer 111, and the insulating layer 112 is disposed at other positions. The electrode PD2 has its −Z-side surface exposed to the bonding surface BF1. The insulating layer 112 has its −Z-side surface exposed to the bonding surface BF1.

The CP2 region includes plural plugs CP2. Each of the plugs CP2 extends in the Z direction. The plug CP2 is not electrically connected to the conductive layer 102 of the memory cell array 11_1. The plug CP2 is electrically connected to one conductive layer 102 in the memory cell array 11_2 and is not electrically connected to the other conductive layers 102. Hereinafter, when the plugs CP2 connected to the conductive layer 102 functioning as the word lines WL0 and WL1 are specified, the plugs CP2 will be denoted as plugs CP2_$w$0 and CP2_$w$1, respectively. When the plugs CP2 connected to the conductive layer 102 functioning as the select gate lines SGD and SGS are specified, the plugs CP2 will be denoted as plugs CP2_$d$ and CP2_$s$, respectively. In the example of FIG. 7, the plugs CP2_$s$, CP2_$w$0, CP2_$w$1, and CP2_$d$ are disposed in this order from the end in the X direction of the memory cell array 11_1 toward the cell portion. The plugs CP2 may be disposed in one row, or may be disposed in two rows in a staggered arrangement.

The conductive layer 111 is disposed on the −Z side of the plug CP2_$d$. The conductive layer 111 is electrically connected to the −Z-side end of the plug CP2 and is connected to the electrode PD2 at a connection position with the plug CP2. The electrode PD2 has its −Z-side surface exposed to the bonding surface BF1. The insulating layer 112 has its −Z-side surface exposed to the bonding surface BF1.

The conductive layer 111 is disposed on the −Z side of the plugs CP1_$s$ to CP1_$w$1, other than the plug CP2_$d$. The conductive layer 111 is electrically connected to −Z-side ends of the plugs CP2_$s$ to CP2_$w$1. The conductive layer 111 is connected to the electrode PD2 on the −Z side at a connection position with the plugs CP2_$s$ to CP2_$w$1. The electrode PD2 has its −Z-side surface exposed to the bonding surface BF1.

The conductive layer 111 extends in the +Y direction or the −Y direction from a connection position with the plugs CP2_$s$ to CP2_$w$1 in the block BK to a connection position with the plugs CP2_$s$ to CP2_$w$1 in the adjacent block BK.

For example, the conductive layer 111 extends in the −Y direction from a connection position with the plugs CP1_$s$ to CP1_$w$1 in the block BK0 to a connection position with the plugs CP2_$s$ to CP2_$w$1 in the block BK1. The plugs CP1_$s$ to CP1_$w$1 and the plugs CP2_$s$ to CP2_$w$1 correspond to each other. Each of the plugs CP1_$s$ to CP1_$w$1 is electrically connected to the corresponding plug CP2 via the conductive layer 111.

Comparing the planar configuration of the memory cell array 11_1 illustrated in FIG. 7 with the planar configuration of the memory cell array 11_2 illustrated in FIG. 6, the number of plugs CP1 in the CP1 region is larger than the number of plugs CP3 in the CP3 region. The number of plugs CP2 in the CP2 region is substantially equal to the number of plugs CP3 in the CP3 region.

Figure 8:
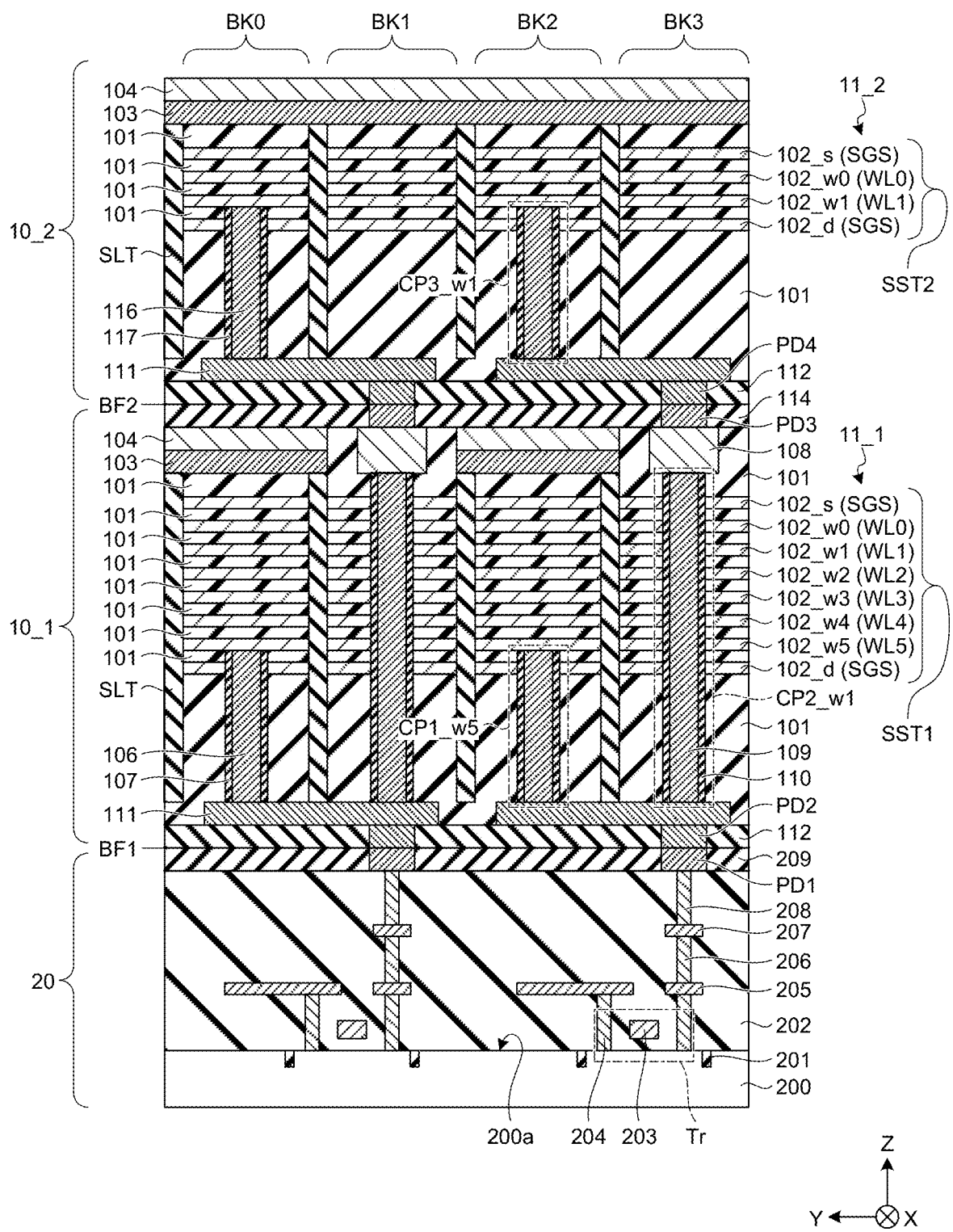
FIG. 8 is a cross-sectional view in a stack direction illustrating a configuration of a plug connection portion in the first embodiment.

Next, a cross-sectional configuration of the plug connection portion will be described with reference to FIG. 8. FIG. 8 is a YZ cross-sectional view illustrating the configuration of the plug connection portion. FIG. 8 corresponds to a cross section of FIG. 6 and FIG. 7 taken along line C-C.

In the plug connection portion, the chips 20, 10_1, and 10_2 are sequentially stacked and bonded. The chip 20 and the chip 10_1 are electrically connected to each other via the electrode PD1 and the electrode PD2. The chip 10_1 and the chip 10_2 are electrically connected to each other via the electrode PD3 and the electrode PD4.

The chip 10_1 includes the memory cell array 11_1 and wiring thereof. The chip 10_1 includes insulating layers 101, 107, 110, 112, and 114, a slit SLT, conductive layers 102, 103, 104, and 111, and conductors 106, 108, and 109.

In the memory cell array 11_1, the insulating layer 101 and the conductive layer 102 are alternately stacked plural times. The plural conductive layers 102 function, in order from the −Z side to the +Z side, as the select gate line SGD, the word line WL5, the word line WL4, the word line WL3, the word line WL2, the word line WL1, the word line WL0, and the select gate line SGS.

In a case where the conductive layer 102 functioning as the word line WL5, WL4, WL3, WL2, WL1, or WL0 is specified, the conductive layer 102 will be denoted as the conductive layer 102_$w$5, 102_$w$4, 102_$w$3, 102_$w$2, 102_$w$1, or 102_$w$0. When the conductive layer 102 functioning as the select gate lines SGD or SGS is specified, the conductive layer 102 is denoted as a conductive layer 102_$d$ or 102_$s$.

The insulating layer 101 may be formed of an insulator such as silicon oxide. The conductive layer 102 can be formed of a material containing a metal such as tungsten as a main component, or a conductive material such as a semiconductor to which conductivity is imparted.

The plural conductive layers 102 are electrically isolated from the conductive layers 102 of the other blocks BK via the slits SLT extending in the XZ direction. The slit SLT may be formed of an insulator such as silicon oxide.

The conductive layer 103 is disposed on the +Z side of the conductive layer 102_$s$ with the insulating layer 101 interposed therebetween. The conductive layer 104 is disposed on the +Z side of the conductive layer 103. The conductive layer 104 covers the +Z-side surface of the conductive layer 103. The conductive layer 103 and the conductive layer 104 function as the source line SL. The conductive layer 104 has its +Z side covered with the insulating layer 114. The insulating layer 114 has its +Z-side surface exposed to the bonding surface BF2.

The conductive layer 103 may be formed of a semiconductor (for example, polysilicon) to which conductivity is imparted. The conductive layer 104 may be formed of a material containing a metal such as aluminum as a main component.

The plug CP1 is disposed on the −Z side of the conductive layer 102. The plug CP1 has a columnar shape, for example, a solid cylindrical shape. The plug CP1 includes the conductor 106 and the insulating layer 107. The conductor 106 has a columnar shape, for example, a solid cylindrical shape. The insulating layer 107 covers a side surface of the conductor 106. The insulating layer 107 has a tubular shape, for example, a hollow cylindrical shape.

The conductor 106 is connected, at its +Z-side end, to a predetermined conductive layer 102. The conductor 106, having its side surface electrically insulated from another conductive layer 102 via the insulating layer 107, penetrates the another conductive layer 102. The conductor 106 is connected, at its −Z side end, to the electrode PD2 via the conductive layer 111. This allows the conductor 106 to electrically connect the predetermined conductive layer 102 and the electrode PD2 to each other. The conductor 106 may be formed of a material containing a metal such as copper as a main component. The insulating layer 107 may be formed of an insulator such as silicon oxide.

The example of FIG. 8 illustrates the plug CP1_$w$5. In the plug CP1_$w$5, the conductor 106 has its +Z-side end connected to the conductive layer 102_$w$5. The plug CP1_$w$5, having its side surface electrically insulated from another conductive layer 102 via the insulating layer 107, penetrates the conductive layer 102_$d$. The plug CP1_$w$5 has its −Z side end connected to the electrode PD2 via the conductive layer 111.

The insulating layer 112 is disposed on the −Z side of the conductive layer 111. The insulating layer 112 has its −Z-side surface exposed to the bonding surface BF1.

The plug CP2 extends through the plural conductive layers 102 in the Z direction. The plug CP2 has a columnar shape, for example, a solid cylindrical shape. The plug CP2 includes the conductor 109 and the insulating layer 110. The conductor 109 has a columnar shape, for example, a solid cylindrical shape. The insulating layer 110 covers a side surface of the conductor 109. The insulating layer 110 has a tubular shape, for example, a hollow cylindrical shape.

In the CP2 region where the plug CP2 is disposed, the conductor 108 is disposed on the +Z side of the plug CP2, with no conductive layers 103/104 disposed. The conductor 109 is connected, at its +Z side end, to the electrode PD3 via the conductor 108. The conductor 109, having its side surface electrically insulated from plural conductive layers 102 via the insulating layer 110, penetrates the plural conductive layers 102. The conductor 109 is connected, at its −Z side end, to the electrode PD2 via the conductive layer 111. This allows the conductor 109 to electrically connect the electrode PD2 and the electrode PD3 to each other. The conductor 109 may be formed of a material containing a metal such as copper as a main component. The insulating layer 110 may be formed of an insulator such as silicon oxide.

The chip 10_2 includes a memory cell array 11_2 and its wiring. The chip 10_2 includes insulating layers 101, 112, and 117, a slit SLT, conductive layers 102, 103, 104, and 111, and a conductor 116.

In the memory cell array 11_2, the insulating layer 101 and the conductive layer 102 are alternately stacked plural times. The conductive layers 102 provided in plurality sequentially function, in order from the −Z side to the +Z side, as the select gate line SGD, the word line WL1, the word line WL0, and the select gate line SGS.

When the conductive layer 102 functioning as the word lines WL1 or WL0 is specified, the conductive layer 102 will be denoted as a conductive layer 102_$w$1 or 102_$w$0. When the conductive layer 102 functioning as the select gate lines SGD or SGS is specified, the conductive layer 102 is denoted as a conductive layer 102_$d$ or 102_$s$.

The insulating layer 101 may be formed of an insulator such as silicon oxide. The conductive layer 102 can be formed of a material containing a metal such as tungsten as a main component, or a conductive material such as a semiconductor to which conductivity is imparted.

The plural conductive layers 102 are electrically isolated from the conductive layers 102 of the other blocks BK via the slits SLT extending in the XZ direction. The slit SLT may be formed of an insulator such as silicon oxide.

The conductive layer 103 is disposed on the +Z side of the conductive layer 102_$s$ with the insulating layer 101 interposed therebetween. The conductive layer 104 is disposed on the +Z side of the conductive layer 103. The conductive layer 104 covers the +Z-side surface of the conductive layer 103. The conductive layer 103 and the conductive layer 104 function as the source line SL.

The conductive layer 103 may be formed of a semiconductor to which conductivity is imparted. The conductive layer 104 may be formed of a material containing a metal such as aluminum as a main component.

The plug CP3 is disposed on the −Z side of the conductive layer 102. The plug CP3 has a columnar shape, for example, a solid cylindrical shape. The plug CP3 includes the conductor 116 and the insulating layer 117. The conductor 116 has a columnar shape, for example, a solid cylindrical shape. The insulating layer 117 covers a side surface of the conductor 116. The insulating layer 117 has a tubular shape, for example, a hollow cylindrical shape.

The conductor 116 is connected, at its +Z-side end, to a predetermined conductive layer 102. The conductor 116, having its side surface electrically insulated from another conductive layer 102 via the insulating layer 117, penetrates the another conductive layer 102. The conductor 116 is connected, at its −Z side end, to the electrode PD4 via the conductive layer 111. This allows the conductor 116 to be selectively electrically connected to the predetermined conductive layer 102. The conductor 116 may be formed of a material containing a metal such as copper as a main component. The insulating layer 117 may be formed of an insulator such as silicon oxide.

The example of FIG. 8 illustrates the plug CP3_$w$1. In the plug CP3_$w$1, the conductor 116 has its +Z-side end connected to the conductive layer 102_$w$1. The plug CP3_$w$1, having its side surface electrically insulated from another conductive layer 102 via the insulating layer 117, penetrates the conductive layer 102_$d$.

The insulating layer 112 is disposed on the −Z side of the conductive layer 111. The insulating layer 112 has its −Z-side surface exposed to the bonding surface BF2.

The chip 20 includes a substrate 200, insulating layers 201, 202, and 209, a gate electrode 203, conductors 204, 206, 208, and 210, and conductive layers 205 and 207.

A well region and an element isolation region are disposed in the vicinity of the surface of the substrate 200. The substrate 200 may be formed of a semiconductor (for example, silicon). The element isolation region electrically isolates the well region from other well regions. The insulating layer 201 is disposed in the element isolation region. The insulating layer 201 may be formed of an insulator such as silicon oxide.

The insulating layer 202 is disposed on the +Z side of the substrate 200. The insulating layer 202 may be formed of an insulator such as silicon oxide.

The transistor Tr includes a gate electrode 203 on the surface 200a of the substrate 200, and includes a source electrode, a drain electrode, and the like in the vicinity of the surface 200a of the substrate 200. The gate electrode 203 may be formed of a semiconductor (for example, polysilicon) to which conductivity is imparted. The source electrode and the drain electrode may be formed as a region containing impurities, on the substrate 200.

The source electrode and the drain electrode are each connected to the conductive layer 205 via the conductor 204. The conductor 204 extends in the Z direction. The conductive layer 205 is connected to the conductive layer 207 via the conductor 206. The conductor 206 extends in the Z direction. The conductive layer 207 is connected to the electrode PD1 via the conductor 208. The conductor 208 extends in the Z direction. The conductors 204, 206, 208, and 210 and the conductive layers 205 and 207 may be formed of a material containing a metal such as aluminum or copper as a main component.

On the +Z side of the insulating layer 202, the electrode PD1 is disposed at a position corresponding to the electrode PD2, while the insulating layer 209 is disposed at other positions. The electrode PD1 may be formed of a material containing a metal such as copper as a main component. The insulating layer 209 may be formed of an insulator such as silicon oxide.

Comparing the cross-sectional configuration of the memory cell array 11_1 and the cross-sectional configuration of the memory cell array 11_2, the number of stack layers in the conductive layers 102 in the memory cell array 11_1 is larger than the number of stack layers in the conductive layers 102 in the memory cell array 11_2. The stack pitch of the conductive layers 102 in the memory cell array 11_1 is substantially equal to the stack pitch of the conductive layers 102 in the memory cell array 11_2. The height in the Z direction of the stack structure SST1 in the memory cell array 11_1 is greater than the height in the Z direction of the stack structure SST2 in the memory cell array 11_2.

Figure 9:
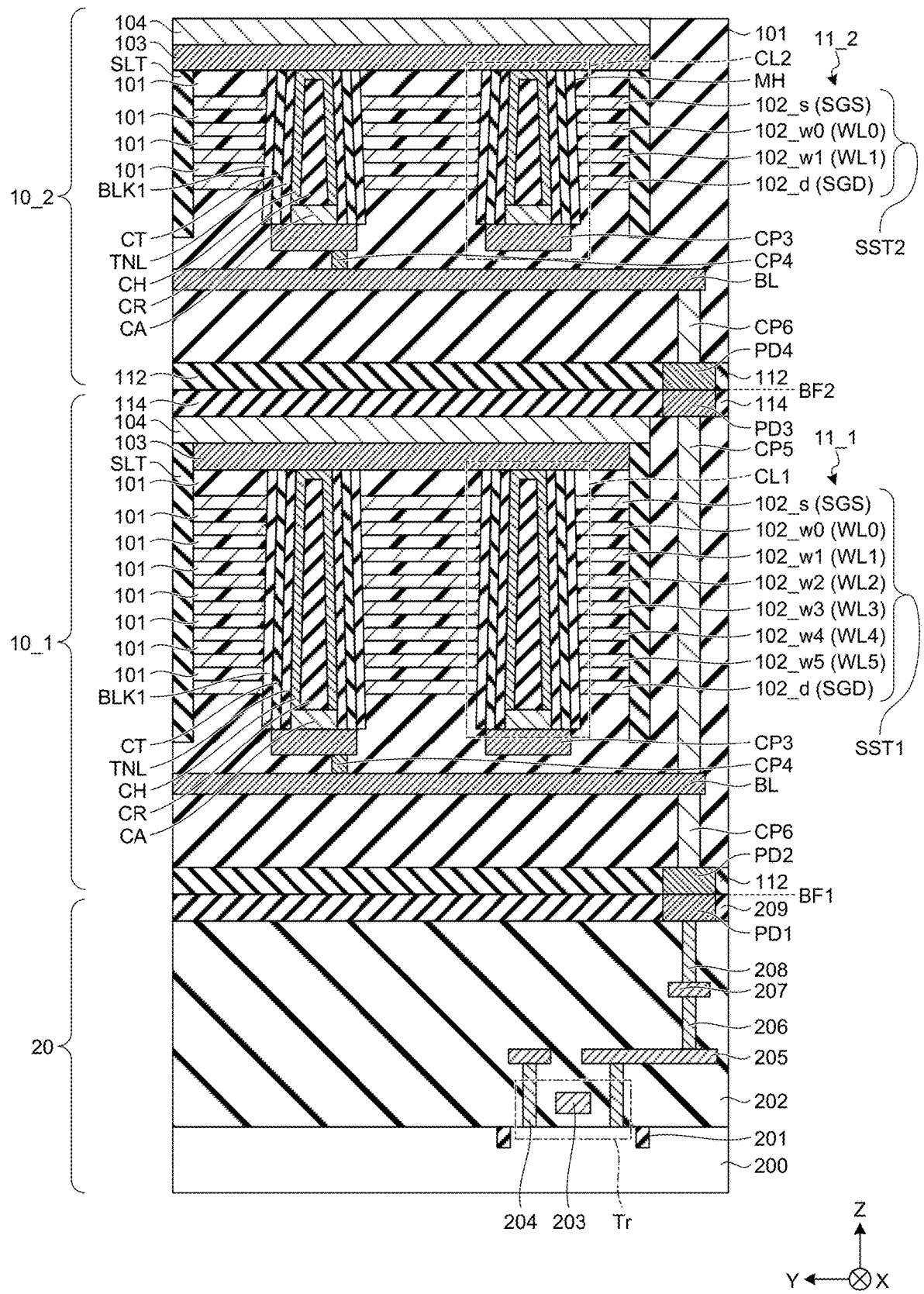
FIG. 9 is a cross-sectional view in a stack direction illustrating a configuration of a cell portion in the first embodiment.

Next, a cross-sectional configuration of the cell portion will be described with reference to FIG. 9. FIG. 9 is a YZ cross-sectional view illustrating the configuration of the cell portion. FIG. 9 corresponds to a cross section of FIGS. 6 and 7 taken along line D-D. For simplification, FIG. 9 omits illustration of the insulating film BLK2.

As illustrated in FIG. 9, a columnar body CL1 is disposed on the chip 10_1, while a columnar body CL2 is disposed on the chip 10_2.

In the chip 10_2, the columnar body CL2 extends in the Z direction in the stack structure SST2 and penetrates the plural conductive layers 102. In the example of FIG. 9, the columnar body CL2 penetrates the four conductive layers 102. The columnar body CL2 has its +Z-side end connected to the conductive layer 103 and its −Z-side end connected to the conductor CP3. The conductor CP3 is connected, at its −Z-side surface, to the conductor CP4. The conductor CP4 extends in the Z direction, having its −Z-side end connected to the conductive film BL.

The columnar body CL2 forms a columnar shape having an axis in the Z direction. As mentioned before (refer to FIGS. 5A and 5B), the columnar body CL2 has a structure in which the insulating film CR, the semiconductor film CH, the insulating film TNL, the charge storage film CT, and the insulating film BLK1 are arranged in order from the axis to the outside. The semiconductor film CH has its +Z-side end covering the +Z-side end of the insulating film CR and being in contact with the conductive layer 103. The semiconductor film CH is, at its −Z side end, in contact with a semiconductor layer CA. The semiconductor layer CA may be formed of a semiconductor such as polysilicon. The semiconductor layer CA is, at its −Z-side surface, in contact with the plug CP3. The plug CP3 is, at its −Z-side end, in contact with the plug CP4. The plug CP4 is, at its −Z side end, in contact with the conductive film BL. The conductive layer 103 functions as a source line SL, and the conductive film BL functions as a bit line. With this configuration, the semiconductor film CH is electrically connected, at its +Z-side end, to the source line SL while being electrically connected, its −Z-side end, to the bit line BL, enabling the semiconductor film CH to function as a channel region in the memory string MS.

In the chip 10_2, plural memory cells MC arranged in the Z direction is formed at plural intersection positions where the plural conductive layers 102 and the columnar bodies CL2 intersect. The plural memory cells MC arranged in the Z direction correspond to the plural memory cells MC (refer to FIG. 2) included in the memory string MS. Plural memory cells MC arranged in the XYZ directions is formed at plural intersection positions where the plural conductive layers 102 and the plural columnar bodies CL2 intersect.

The conductive film BL extends in the Y direction. The conductive film BL is connected, at its −Z-side surface, to the electrode PD4 via the plug CP6 at a position shifted in the Y direction from the stack structure SST1. The electrode PD4 has its −Z-side surface exposed to the bonding surface BF2.

In the chip 10_1, the columnar body CL1 extends in the Z direction in the stack structure SST1 and penetrates the plural conductive layers 102. In the example of FIG. 9, the columnar body CL2 penetrates the conductive layers 102 formed of eight layers. The columnar body CL2 has its +Z-side end connected to the conductive layer 103 and its −Z-side end connected to the conductor CP3. The conductor CP3 is connected, at its −Z-side surface, to the conductor CP4. The conductor CP4 extends in the Z direction, having its −Z-side end connected to the conductive film BL.

The columnar body CL1 forms a columnar shape having an axis in the Z direction. As mentioned before (refer to FIGS. 5A and 5B), the columnar body CL1 has a structure in which the insulating film CR, the semiconductor film CH, the insulating film TNL, the charge storage film CT, and the insulating film BLK1 are arranged in order from the axis to the outside. The semiconductor film CH has its +Z-side end covering the +Z-side end of the insulating film CR and being in contact with the conductive layer 103. The semiconductor film CH is, at its −Z side end, in contact with a semiconductor layer CA. The semiconductor layer CA may be formed of a semiconductor such as polysilicon. The semiconductor layer CA is, at its −Z-side surface, in contact with the plug CP3. The plug CP3 is, at its −Z-side end, in contact with the plug CP4. The plug CP4 is, at its −Z side end, in contact with the conductive film BL. The conductive layer 103 functions as a source line SL, and the conductive film BL functions as a bit line. With this configuration, the semiconductor film CH is electrically connected, at its +Z-side end, to the source line SL while being electrically connected, its −Z-side end, to the bit line BL, enabling the semiconductor film CH to function as a channel region in the memory string MS.

In the chip 10_1, plural memory cells MC arranged in the Z direction is formed at plural intersection positions where the plural conductive layers 102 and the columnar bodies CL1 intersect. The plural memory cells MC arranged in the Z direction correspond to the plural memory cells MC (refer to FIG. 2) included in the memory string MS. Plural memory cells MC arranged in the XYZ directions is formed at plural intersection positions where the plural conductive layers 102 and the plural columnar bodies CL1 intersect.

The conductive film BL extends in the Y direction. The conductive film BL is connected, at its −Z-side surface, to the electrode PD2 via the plug CP6 at a position shifted in the Y direction from the stack structure SST1. The electrode PD2 has its −Z-side surface exposed to the bonding surface BF1.

In addition, the conductive film BL is connected, at its +Z-side surface, to the electrode PD3 via the plug CP5 at a position shifted in the Y direction from the stack structure SST1. The electrode PD3 has its +Z side surface, exposed to the bonding surface BF2 so as to be in contact with the electrode PD4.

That is, the columnar body CL1 of the memory cell array 11_1 and the columnar body CL2 of the memory cell array 11_2 are electrically connected in parallel to the transistor Tr of the chip 10.

Comparing the cross-sectional configuration of the memory cell array 11_1 and the cross-sectional configuration of the memory cell array 11_2, the number of stack layers in the conductive layers 102 in the memory cell array 11_1 is larger than the number of stack layers in the conductive layers 102 in the memory cell array 11_2. The stack pitch of the conductive layers 102 in the memory cell array 11_1 is substantially equal to the stack pitch of the conductive layers 102 in the memory cell array 11_2. The height of the columnar body CL1 in the Z direction in the memory cell array 11_1 is greater than the height of the columnar body CL2 in the Z direction in the memory cell array 11_2. The height of the semiconductor film CH in the Z direction in the memory cell array 11_1 is greater than the height of the semiconductor film CH in the Z direction in the memory cell array 11_2. The number of intersection positions of the conductive layer 102 and the columnar bodies CL1 in the memory cell array 11_1 is larger than the number of intersection positions of the conductive layer 102 and the columnar bodies CL2 in the memory cell array 11_2. The number of memory cells MC arranged in the Z direction in the memory cell array 11_1 is larger than the number of memory cells MC arranged in the Z direction in the memory cell array 11_2.

As described above, in the first embodiment, in the semiconductor memory device 1, the number of stack layers in the conductive layers 102 is varied between the stack structure SST1 and the stack structure SST2 arranged in the Z direction. This leads to formation of different lengths in the Z direction between the semiconductor film CH penetrating the stack structure SST1 and the semiconductor film CH penetrating the stack structure SST2. This leads to a difference in a wiring load in each memory string MS of the memory cell array 11_1 and the wiring load of each memory string MS of the memory cell array 11_2, resulting in a difference in periods tR in the read operation between the memory cell array 11_1 and the memory cell array 11_2. That is, the memory cell array 11_1 and the memory cell array 11_2 may implement different functions regarding the read operation, making it possible to utilize the memory cell array 11_1 and the memory cell array 11_2 selectively for each application. This facilitates achievement of multifunctional operation of the read processing in the semiconductor memory device 1, leading to successful handling of various requests in parallel.

It should be noted that the configuration for separately driving the memory cell array 11_1 and the memory cell array 11_2 while the word line WL is connected as a common line is not limited to the configuration in which the bit line BL is connected as a common line and the select gate lines SGD_1 and SGD_2 are connected as independent lines (refer to FIG. 3). The bit lines BL_1 and BL_2 may be connected as independent lines and the select gate line SGD may be connected as a common line. In this case, the bit line BL_1 is connected to the cell portion of the memory cell array 11_1, the bit line BL_2 is connected to the cell portion of the memory cell array 11_2, and the bit lines BL_1 and BL_2 are insulated from each other.

Second Embodiment

Next, a semiconductor memory device 1$i$ according to a second embodiment will be described. In the following, portions different from the first embodiment will be mainly described.

While the first embodiment has illustrated a structure in which the number of stack layers in the conductive layers 102 is varied between the stack structure SST1 and the stack structure SST2, the second embodiment will illustrate a structure in which the stack pitch of the conductive layers 102 is varied between a stack structure SST1 and a stack structure SST2$i$.

Figure 10:
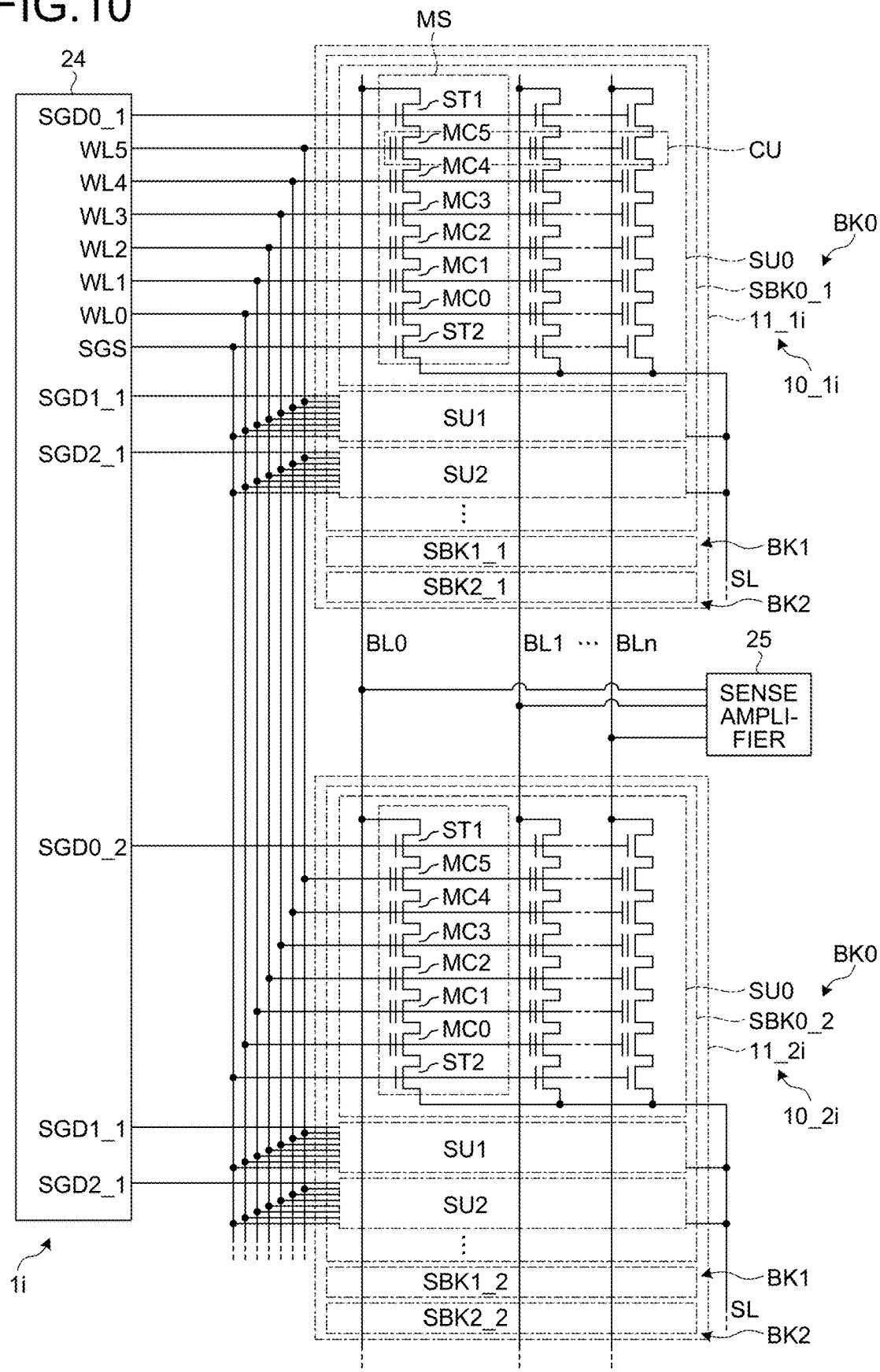
FIG. 10 is a circuit diagram illustrating a configuration of a block in a second embodiment.

In the semiconductor memory device 1$i$, the number of stack layers in the conductive layers 102 functioning as the word lines WL is substantially equal between the stack structure SST1 and the stack structure SST2$i$. Accordingly, as illustrated in FIG. 10, the number of connected word lines WL is substantially equal between each memory string MS of a memory cell array 11_1$i$ of a chip 10_1$i$ and each memory string MS of a memory cell array 11_2$i$ of a chip 10_2$i$. FIG. 10 is a circuit diagram illustrating a configuration of a block BK in the semiconductor memory device 1$i$. Accordingly, the number of included memory cells MC is substantially equal between each memory string MS of the memory cell array 11_1$i$ and each memory string MS of the memory cell array 11_2$i$.

In the example of FIG. 10, each memory string MS of the memory cell array 11_1$i$ and each memory string MS of the memory cell array 11_2$i$ are individually connected to six word lines WL0 to WL5. Accordingly, each memory string MS of the memory cell array 11_1$i$ and each memory string MS of the memory cell array 11_2$i$ individually include six memory cells MC0 to MC5.

Figure 11:
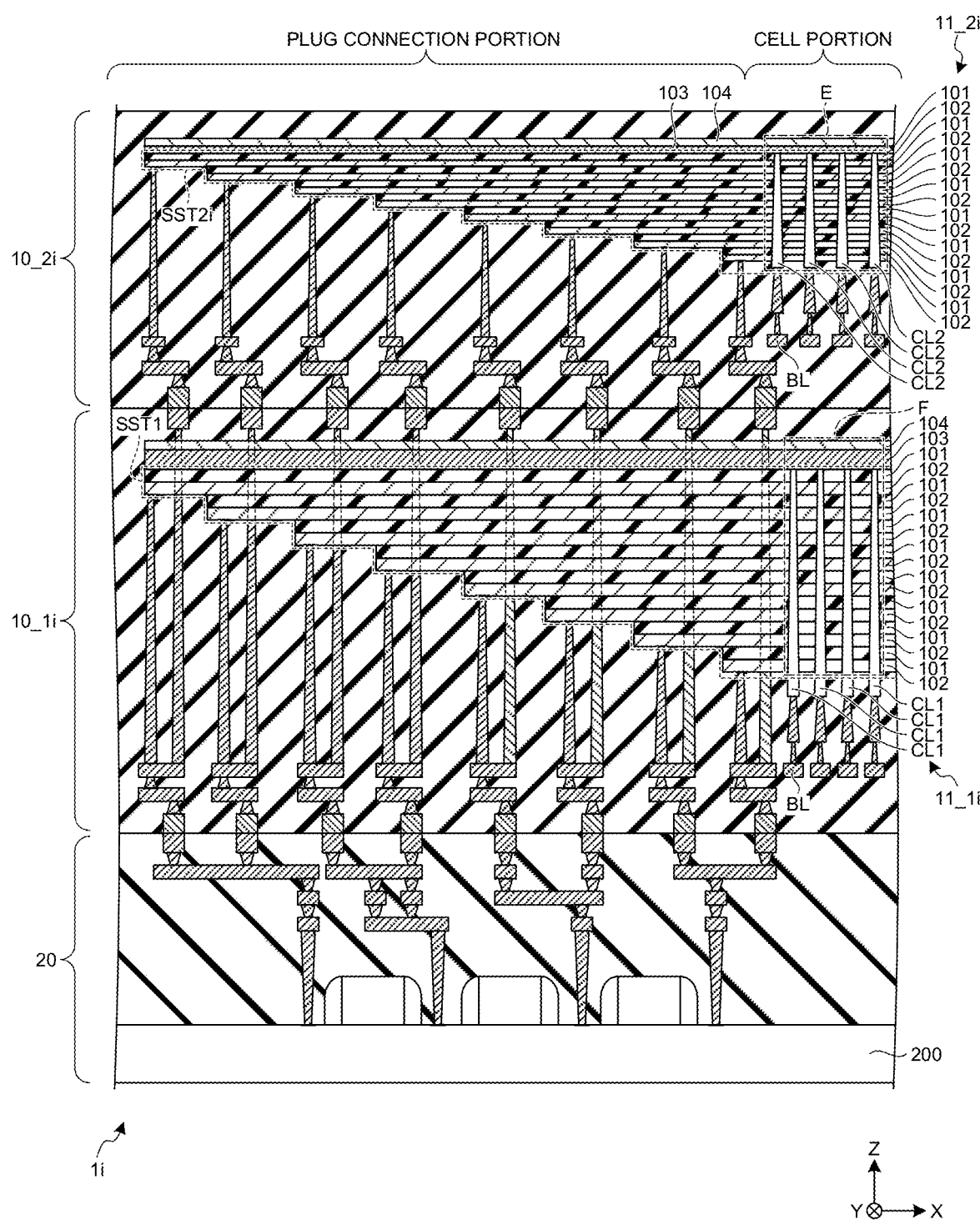
FIG. 11 is a cross-sectional view in the stack direction illustrating a configuration of the semiconductor memory device according to the second embodiment.
Figure 12A:
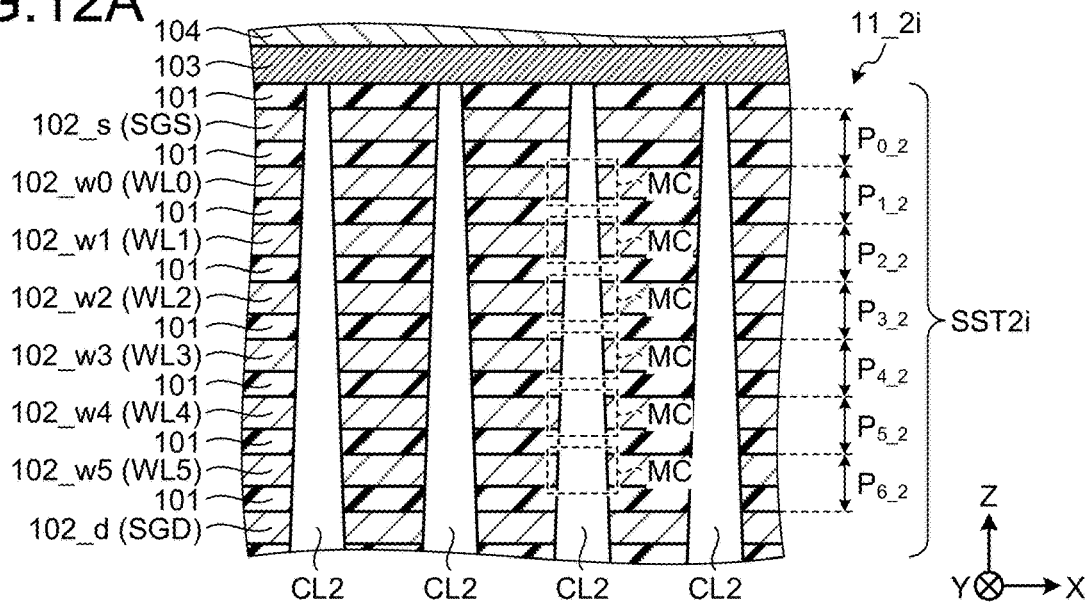
FIGS. 12A and 12B are cross-sectional views in the stack direction illustrating a stack pitch in the second embodiment.
Figure 12B:
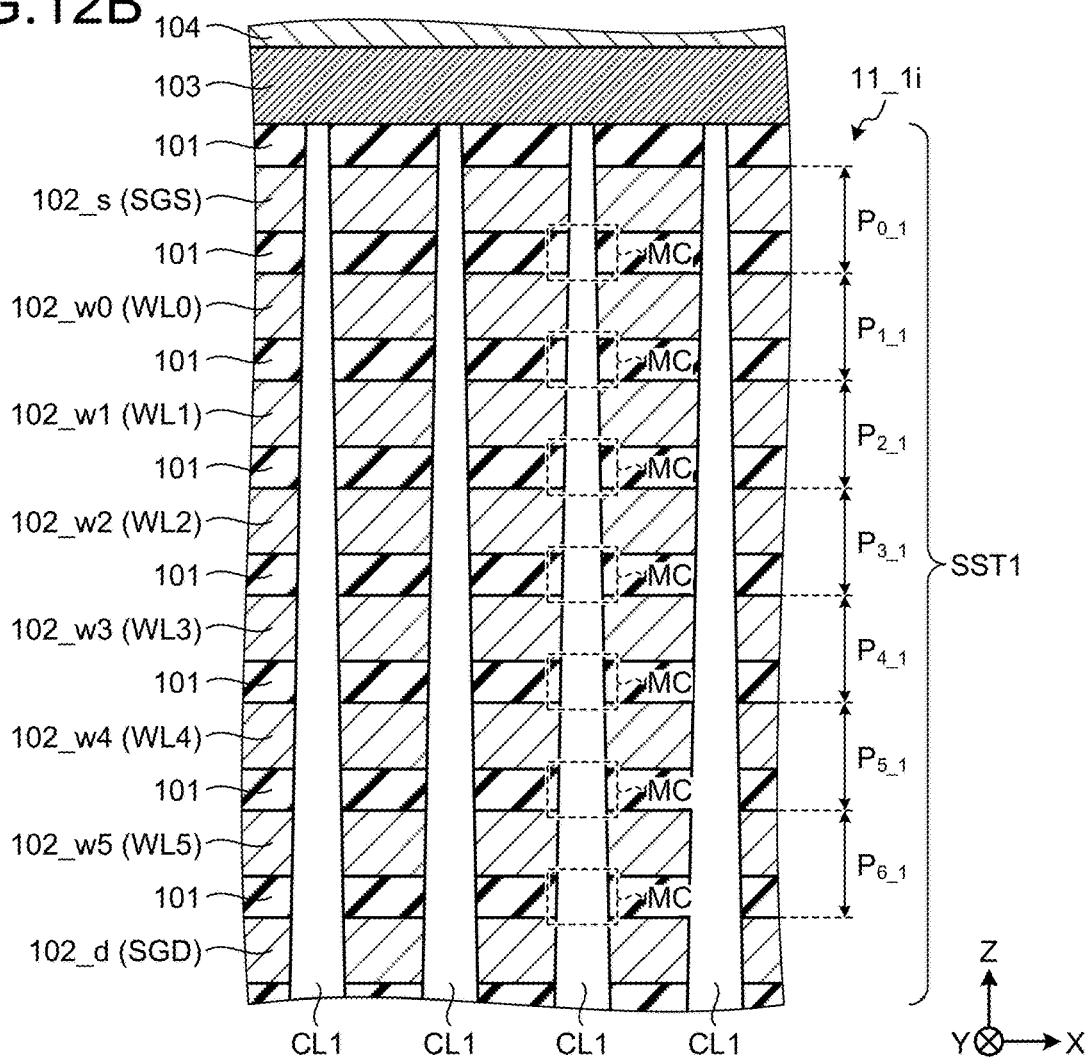

In the semiconductor memory device 1$i$, as illustrated in FIGS. 11, 12A, and 12B, stack pitches $P_{0\_1}$ to $P_{6\_1}$ of conductive layers 102_$s$ to 102_$d$ in the stack structure SST1 are respectively different from stack pitches $P_{0\_2}$ to $P_{6\_2}$ of conductive layers 102_$s$ to 102_$d$ in the stack structure SST2$i$. FIG. 11 is an XZ cross-sectional view illustrating the configuration of the semiconductor memory device 1$i$. FIGS. 12A and 12B are XZ cross-sectional views illustrating the stack pitch. FIG. 12A is an enlarged cross-sectional view of portion E in FIG. 11, and FIG. 12B is an enlarged cross-sectional view of portion F in FIG. 11.

The film thickness of the conductive layer 102 in the Z direction in the stack structure SST1 and the film thickness of the conductive layer 102 in the Z direction in the stack structure SST2$i$ are different from each other in accordance with the difference between the stack pitches $P_{0\_1}$ to $P_{6\_1}$ and the stack pitches $P_{0\_2}$ to $P_{6\_2}$. Accordingly, the semiconductor film CH of the columnar body CL1 penetrating the stack structure SST1 and the semiconductor film CH of the columnar body CL2 penetrating the stack structure SST2$i$ have different lengths in the Z direction. This leads to a difference between the wiring load of the word line WL in the memory cell array 11_1$i$ and the wiring load of the word line WL in the memory cell array 11_2$i$, and a difference in the write time in the write operation between the memory cell array 11_1$i$ and the memory cell array 11_2$i$. That is, the memory cell array 11_1$i$ and the memory cell array 11_2$i$ may implement different functions regarding the write operation, making it possible to utilize the memory cell array 11_1$i$ and the memory cell array 11_2$i$ selectively for each application.

For example, as illustrated in FIGS. 11, 12A and 12B, the stack pitches $P_{0\_1}$ to $P_{6\_1}$ of the conductive layers 102_$s$ to 102_$d$ in the stack structure SST1 are respectively larger than the stack pitches $P_{0\_2}$ to $P_{6\_2}$ of the conductive layers 102_$s$ to 102_$d$ in the stack structure SST2$i$. When the stack pitches $P_{0\_1}$ to $P_{6\_1}$ of the conductive layers 102_$s$ to 102_$d$ in the stack structure SST1 are substantially equal to each other, and the stack pitches $P_{0\_2}$ to $P_{6\_2}$ of the conductive layers 102_$s$ to 102_$d$ in the stack structure SST2$i$ are substantially equal to each other, the following Formula 1 is satisfied.

$$P_{0\_1} \approx P_{1\_1} \approx P_{2\_1} \approx P_{3\_1} \approx P_{4\_1} \approx P_{5\_1} \approx P_{6\_1} > P_{0\_2} \approx P_{1\_2} \approx P_{2\_2} \approx P_{3\_2} \approx P_{4\_2} \approx P_{5\_2} \approx P_{6\_2} \quad \text{Formula 1}$$

According to the relationship represented by Formula 1, the film thickness of the conductive layer 102 in the Z direction in the stack structure SST1 is larger than the film thickness of the conductive layer 102 in the Z direction in the stack structure SST2$i$. This makes the wiring load of the word line WL in the memory cell array 11_1$i$ lower than the wiring load of the word line WL in the memory cell array 11_2$i$. This makes it possible, in the write operation, to implement an operation with high-speed charge and discharge of the word line WL with a short write time in the memory cell array 11_1$i$, and implement an operation with low-speed charge and discharge of the word line WL with a long write time in the memory cell array 11_2$i$. The write time is a time from the reception of the write command by the semiconductor memory device 1$i$ to the return of write completion notification by the semiconductor memory device 1$i$.

Here, the memory cell array 11_1$i$ is characterized in that the conductive layers 102 in the stack structure SST1 has a large stack pitch and the manufacturing cost is high, while the memory cell array 11_2$i$ is characterized in that the conductive layers 102 in the stack structure SST2$i$ has a small stack pitch and the manufacturing cost is low. That is, when there is a demand for a high-speed write operation even with a high cost, the write operation may be performed using the memory cell array 11_1$i$, and when there is a demand for a low-cost write operation even with a low speed, the write operation can be performed using the memory cell array 11_2$i$.

Note that it is desirable that the stack pitch P of the conductive layers 102_$s$ to 102_$d$ be different by 5% to 20% between the stack structure SST1 and the stack structure SST2$i$. For example, when the stack pitch $P_{*\_1}$ of the conductive layers 102 in the stack structure SST1 is larger than the stack pitch $P_{*\_2}$ of the conductive layers 102 in the stack structure SST2$i$, it is desirable to satisfy the following Formula 2.

$$1.05 \leq P_{0\_1}/P_{0\_2} \leq 1.20, 1.05 \leq P_{1\_1}/P_{1\_2} \leq 1.20, 1.05 \leq P_{2\_1}/P_{2\_2} \leq 1.20, 1.05 \leq P_{3\_1}/P_{3\_2} \leq 1.20, 1.05 \leq P_{4\_1}/P_{4\_2} \leq 1.20, 1.05 \leq P_{5\_1}/P_{5\_2} \leq 1.20, 1.05 \leq P_{6\_1}/P_{6\_2} \leq 1.20 \quad \text{Formula 2}$$

By satisfying Formula 2, a significant difference in performance can be obtained between the memory cell array 11_1$i$ and the memory cell array 11_2$i$.

In addition, the height of the stack structure SST1 in the Z direction and the height of the stack structure SST2$i$ the Z direction may be different from each other in accordance with the fact that the stack pitch P of the conductive layers 102 is different between the stack structure SST1 and the stack structure SST2$i$ and that the number of stack layers in the conductive layers 102 is equal between the stack structure SST1 and the stack structure SST2$i$. Accordingly, the height of each columnar body CL1 in Z direction in the memory cell array 11_1$i$ and the height of each columnar body CL2 in the Z direction in the memory cell array 11_2$i$ may be different from each other.

In the case of FIGS. 11, 12A and 12B, the height of the stack structure SST1 in the Z direction is greater than the height of the stack structure SST2$i$ in the Z direction in accordance with that fact that the stack pitch P of the conductive layers 102 of the stack structure SST1 is larger than the stack pitch P of the conductive layers 102 of the stack structure SST2$i$ and that the number of stack layers in the conductive layers 102 of the stack structure SST1 and the stack structure SST2$i$ are substantially equal. The height of the columnar body CL1 in the Z direction in the memory cell array 11_1$i$ is greater than the height of the columnar body CL2 in the Z direction in the memory cell array 11_2$i$.

In addition, each stack pitch P is substantially equal to the sum of the film thickness of the conductive layer 102 and the film thickness of the insulating layer 101. In the stack structure SST1, the respective stack pitches P may be substantially equal to each other. The ratio of the film thickness of the conductive layer 102 to each stack pitch P may be substantially equal to each other. The film thickness of the conductive layer 102 and the film thickness of the insulating layer 101 may be substantially equal to each other. The ratio of the film thickness of the conductive layer 102 to each stack pitch P may be about 50%. Similarly, in the stack structure SST2, each stack pitch P may be substantially equal to each other. The ratio of the film thickness of the conductive layer 102 to each stack pitch P may be substantially equal to each other. The film thickness of the conductive layer 102 and the film thickness of the insulating layer 101 may be substantially equal to each other. The ratio of the film thickness of the conductive layer 102 to each stack pitch P may be about 50%.

Alternatively, although not illustrated, the stack pitches $P_{0\_1}$ to $P_{6\_1}$ of the conductive layers 102_$s$ to 102_$d$ in the stack structure SST1 may be smaller than the stack pitches $P_{0\_2}$ to $P_{6\_2}$ of the conductive layers 102_$s$ to 102_$d$ in the stack structure SST2$i$. With this configuration, the film thickness in the Z direction of the conductive layer 102 in the stack structure SST1 may be smaller than the film thickness in the Z direction of the conductive layer 102 in the stack structure SST2$i$. This makes the wiring load of the word line WL in the memory cell array 11_1$i$ higher than the wiring load of the word line WL in the memory cell array 11_2$i$. This makes it possible, in the write operation, to implement an operation with low-speed charge and discharge of the word line WL with a long write time in the memory cell array 11_1$i$, and implement an operation with high-speed charge and discharge of the word line WL with a short write time in the memory cell array 11_2$i$.

In addition, the stack pitches $P_{0\_1}$ to $P_{6\_1}$ of the conductive layers 102_$s$ to 102_$d$ in the stack structure SST1 are respectively different from the stack pitches $P_{0\_2}$ to $P_{6\_2}$ of the conductive layers 102_$s$ to 102_$d$ in the stack structure SST2$i$. This leads to a difference in the interval of the memory cell MC in the Z direction in the memory cell array 11_1$i$ from the interval of the memory cell MC in the Z direction in the memory cell array 11_1$i$, and the difference in data retention characteristics between the memory cell array 11_1$i$ and the memory cell array 11_2$i$. That is, the memory cell array 11_1$i$ and the memory cell array 11_2$i$ may implement different functions regarding the read data reliability, making it possible to utilize the memory cell array 11_1$i$ and the memory cell array 11_2$i$ selectively for each application.

For example, as illustrated in FIGS. 11, 12A and 12B, the stack pitches $P_{0\_1}$ to $P_{6\_1}$ of the conductive layers 102_$s$ to 102_$d$ in the stack structure SST1 are respectively larger than the stack pitches $P_{0\_2}$ to $P_{6\_2}$ of the conductive layers 102_$s$ to 102_$d$ in the stack structure SST2$i$. Accordingly, the interval of the memory cells MC in the Z direction in the memory cell array 11_1$i$ (refer to FIG. 12B) is larger than the interval of the memory cells MC in the Z direction in the memory cell array 11_2$i$ (refer to FIG. 12A). With this configuration, the data retention characteristic of the memory cell MC in the memory cell array 11_1$i$ is better than the data retention characteristic of the memory cell MC in the memory cell array 11_2$i$. Therefore, in the read operation, high-reliability data may be read from the memory cell MC in the memory cell array 11_1$i$, and low reliable data may be read from the memory cell MC in the memory cell array 11_2$i$.

Here, the memory cell array 11_1$i$ is characterized in that the conductive layers 102 in the stack structure SST1 has a large stack pitch and the manufacturing cost is high, while the memory cell array 11_2$i$ is characterized in that the conductive layers 102 in the stack structure SST2$i$ has a small stack pitch and the manufacturing cost is low. That is, when there is a demand for a high-reliability read operation even with a high cost, the read operation is performed using the memory cell array 11_1$i$, and when there is a demand for a low-cost read operation even with low reliability, the read operation may be performed using the memory cell array 11_2$i$.

Note that the number of memory cells MC in the memory string MS of the memory cell array 11_1$i$ and the number of memory cells MC in the memory string MS of the memory cell array 11_2 may be substantially equal to each other.

Alternatively, although not illustrated, the stack pitches $P_{0\_1}$ to $P_{6\_1}$ of the conductive layers 102_$s$ to 102_$d$ in the stack structure SST1 may be smaller than the stack pitches $P_{0\_2}$ to $P_{6\_2}$ of the conductive layers 102_$s$ to 102_$d$ in the stack structure SST2$i$. Accordingly, the interval of the memory cells MC in the Z direction in the memory cell array 11_1$i$ is smaller than the interval of the memory cells MC in the Z direction in the memory cell array 11_2$i$. With this configuration, the data retention characteristic of the memory cell MC in the memory cell array 11_1$i$ is degraded compared with the data retention characteristic of the memory cell MC in the memory cell array 11_2$i$. Therefore, in the read operation, low-reliability data may be read from the memory cell MC in the memory cell array 11_1$i$, and high-reliability data may be read from the memory cell MC in the memory cell array 11_2$i$.

Figure 13:
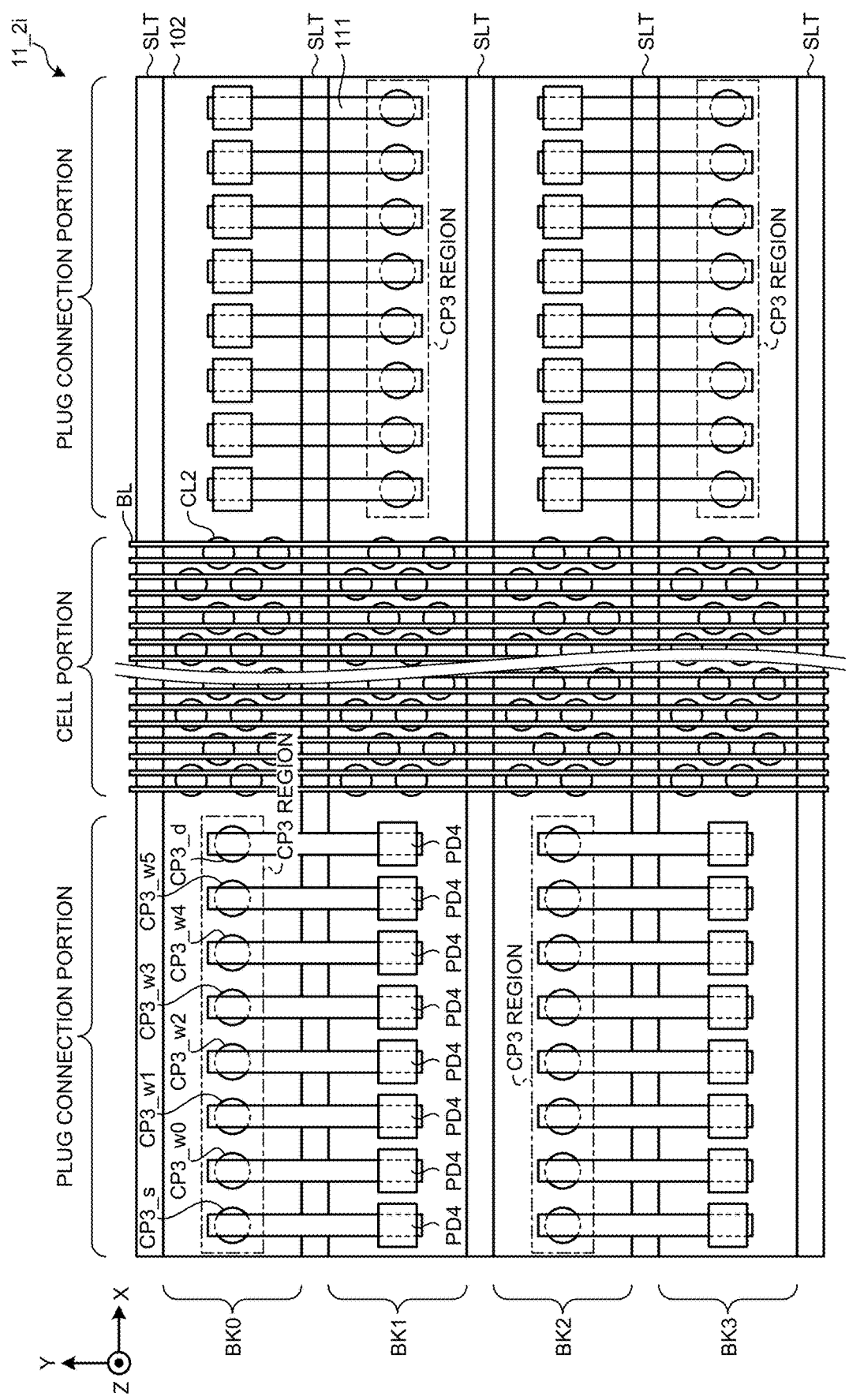
FIG. 13 is a plan view illustrating the configuration of the semiconductor memory device according to the second embodiment.

In addition, the planar configuration of the memory cell array 11_2$i$ is different from that of the first embodiment in the following points as illustrated in FIG. 13. FIG. 13 is an XY plan view illustrating a configuration of the memory cell array 11_2$i$.

In each block BK of the memory cell array 11_2$i$, eight conductive layers 102 functioning as the select gate line SGS, the word lines WL0 to WL5, and the select gate line SGD are stacked.

The CP3 region includes plural plugs CP3 correspondingly. In the example of FIG. 13, the plugs CP3_$s$, CP3_$w$0, CP3_$w$1, CP3_$w$2, CP3_$w$3, CP3_$w$4, CP3_$w$5, and CP3_$d$ are disposed in this order from the end in the X direction of the memory cell array 11_2$i$ toward the cell portion. The other points are similar to the planar configuration illustrated in FIG. 6.

Figure 14:
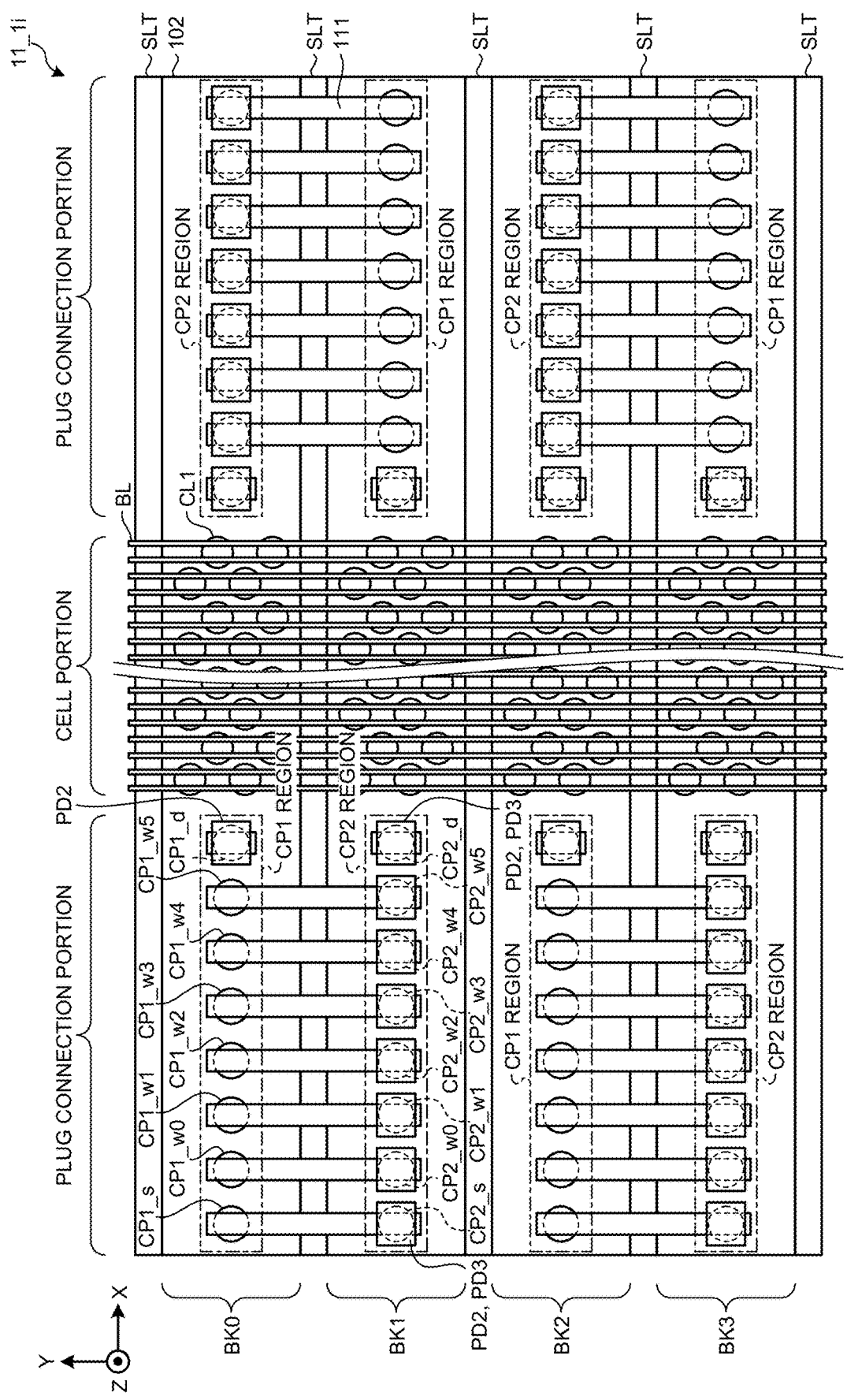
FIG. 14 is a plan view illustrating the configuration of the semiconductor memory device according to the second embodiment.

As illustrated in FIG. 14, the planar configuration of the memory cell array 11_2$i$ is different from that of the first embodiment in the following points. FIG. 14 is an XY plan view illustrating a configuration of the memory cell array 11_1$i$.

In each block BK of the memory cell array 11_1$i$, eight conductive layers 102 functioning as the select gate line SGS, the word lines WL0 to WL5, and the select gate line SGD are stacked.

The CP2 region includes plural plugs CP3 correspondingly. In the example of FIG. 14, the plugs CP3_$s$, CP3_$w$0, CP3_$w$1, CP3_$w$2, CP3_$w$3, CP3_$w$4, CP3_$w$5, and CP3_$d$ are arranged in this order from the end in the X direction of the memory cell array 11_1$i$ toward the cell portion. The other points are similar to the planar configuration illustrated in FIG. 7.

Comparing the planar configuration of the memory cell array 11_1$i$ illustrated in FIG. 14 with the planar configuration of the memory cell array 11_2$i$ illustrated in FIG. 13, the number of plugs CP1 in the CP1 region is substantially equal to the number of plugs CP3 in the CP3 region. The number of plugs CP2 in the CP2 region is substantially equal to the number of plugs CP3 in the CP3 region.

As described above, in the second embodiment, in the semiconductor memory device 1$i$, the stack pitch of the conductive layers 102 is varied between the stack structure SST1 and the stack structure SST2$i$ arranged in the Z direction. Accordingly, the semiconductor film CH of the columnar body CL penetrating the stack structure SST1 and the semiconductor film CH of the columnar body CL penetrating the stack structure SST2$i$ have different lengths in the Z direction. This leads to a difference in a wiring load in each memory string MS of the memory cell array 11_1$i$ and the wiring load of each memory string MS of the memory cell array 11_2$i$, resulting in a difference in the write time in the write operation between the memory cell array 11_1$i$ and the memory cell array 11_2$i$. That is, the memory cell array 11_1$i$ and the memory cell array 11_2$i$ can implement different functions regarding the write operation, making it possible to utilize the memory cell array 11_1$i$ and the memory cell array 11_2$i$ selectively for each application. This facilitates achievement of multifunctional operation of the write processing in the semiconductor memory device 1$i$, leading to successful handling of various requests in parallel.

Additionally, in the second embodiment, in the semiconductor memory device 1i, the stack pitch of the conductive layers 102 is varied between the stack structure SST1 and the stack structure SST2i arranged in the Z direction. This leads to a difference in the interval of the memory cell MC in the Z direction in the memory cell array 11_1i from the interval of the memory cell MC in the Z direction in the memory cell array 11_1i, and the difference in data retention characteristics between the memory cell array 11_1i and the memory cell array 11_2i. That is, the memory cell array 11_1i and the memory cell array 11_2i may implement different functions regarding the read data reliability, making it possible to utilize the memory cell array 11_1i and the memory cell array 11_2i selectively for each application. This facilitates achievement of multifunctional operation of the read processing in the semiconductor memory device 1i, leading to successful handling of various requests in parallel.

Third Embodiment

Next, a semiconductor memory device 1j according to a third embodiment will be described. In the following, portions different from the first embodiment and the second embodiment will be mainly described.

In contrast to the first embodiment that has illustrated a structure in which the number of stack layers in the conductive layers 102 in the stack structure SST is varied between the memory cell arrays 11, the third embodiment will illustrate a structure in which the film thickness of the charge storage film CT is varied between the memory cell arrays 11.

Figure 15:
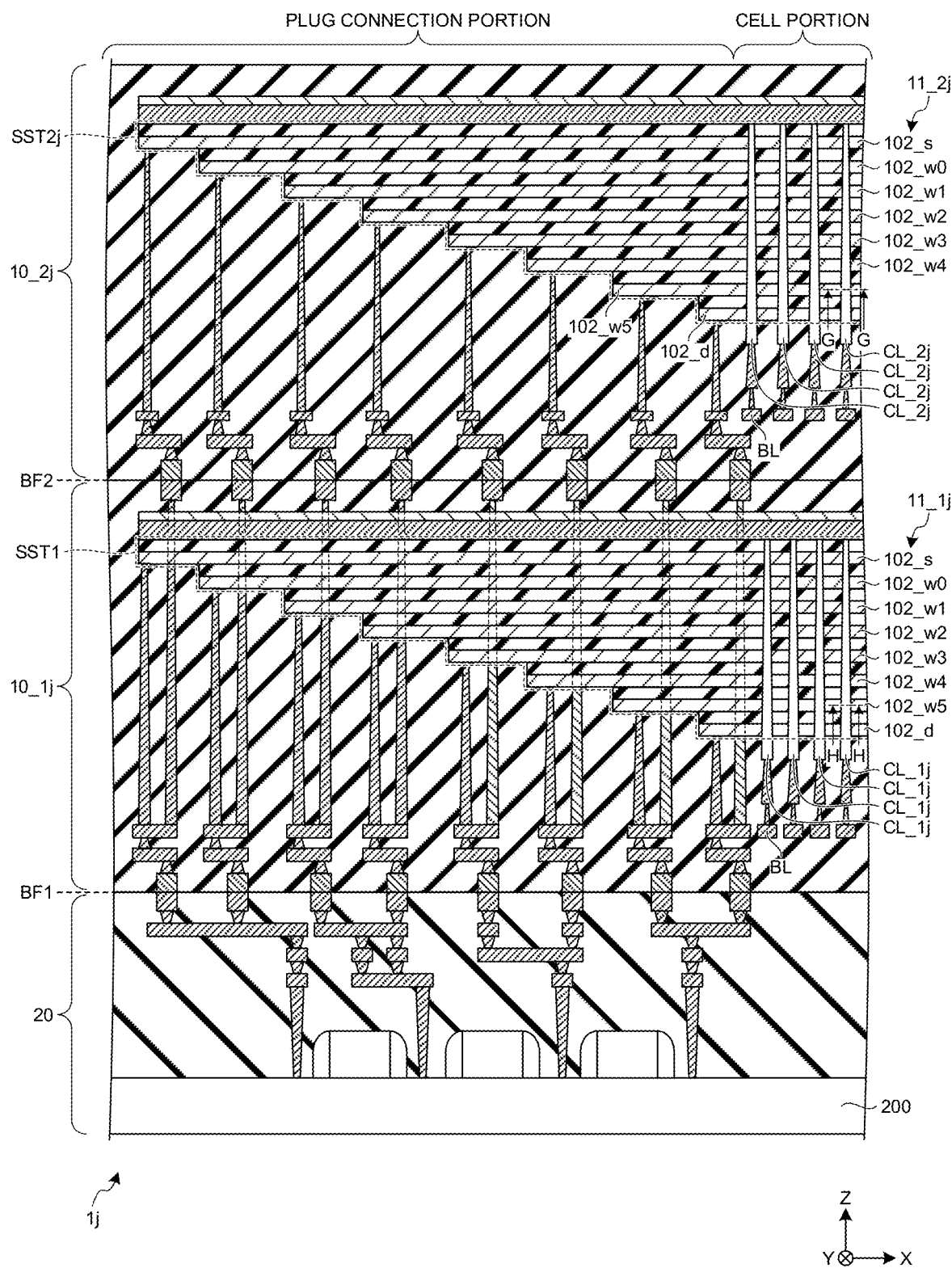
FIG. 15 is a cross-sectional view in the stack direction illustrating a configuration of a semiconductor memory device according to a third embodiment.
Figure 16A:
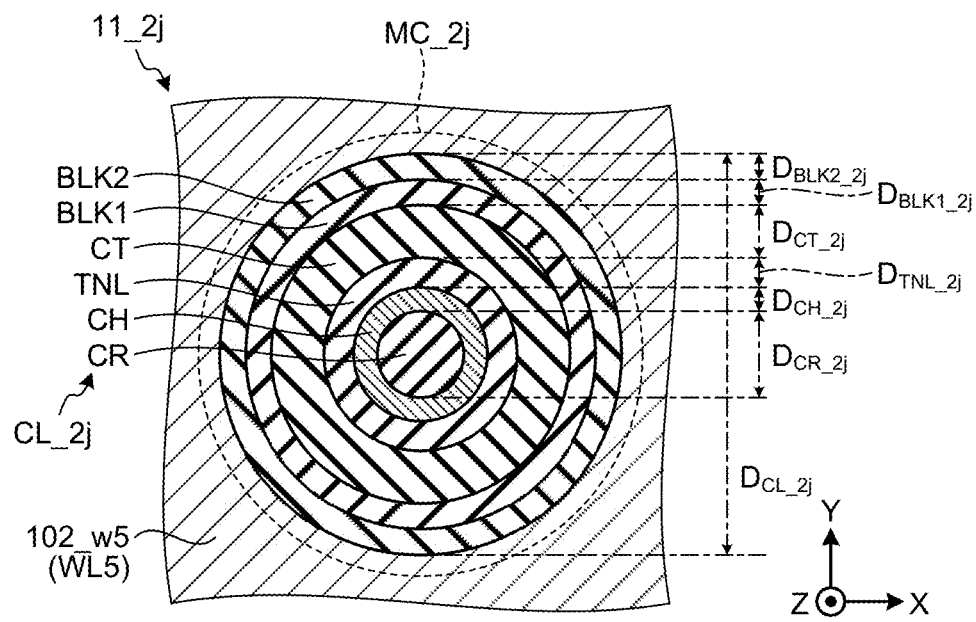
FIGS. 16A and 16B are cross-sectional views in the planar direction illustrating a configuration of a memory cell according to the third embodiment.
Figure 16B:
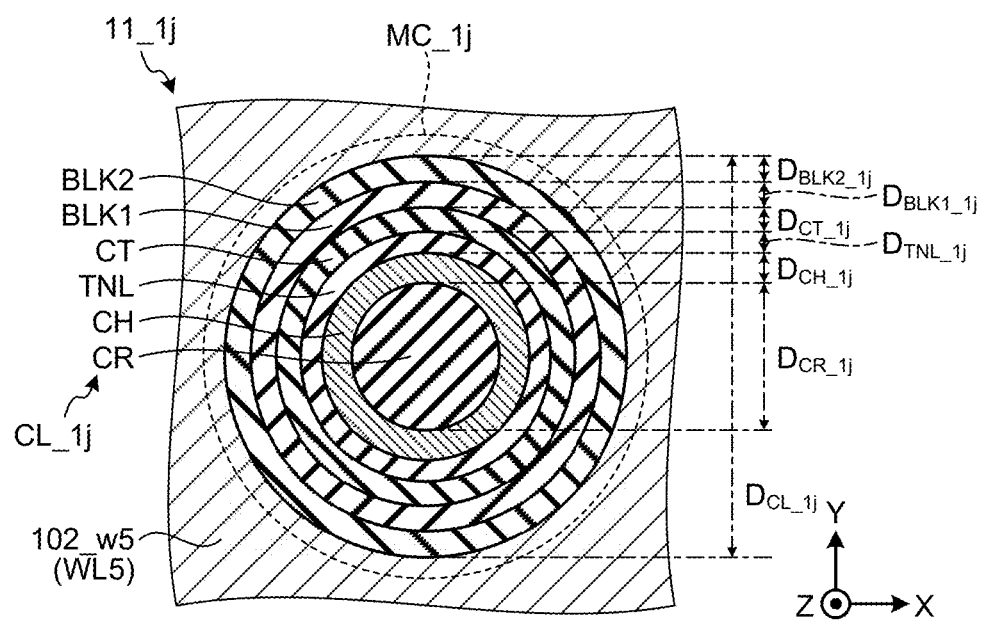

In the semiconductor memory device 1j, as illustrated in FIGS. 15, 16A, and 16B, a film thickness $D_{CT\_1j}$ of a charge storage film CT in a memory cell MC_1j of a memory cell array 11_1j is different from a film thickness $D_{CT\_2j}$ of a charge storage film CT in a memory cell MC_2j of a memory cell array 11_2j. FIG. 15 is an XZ cross-sectional view illustrating a configuration of the semiconductor memory device 1j. FIGS. 16A and 16B are XY cross-sectional views illustrating configurations of the memory cells MC_1j and MC_2j. FIG. 16A is an XY cross-sectional view of the memory cell MC_2j and corresponds to an XY cross-sectional view taken along line G-G of FIG. 15. FIG. 16B is an XY cross-sectional view of the memory cell MC_2j and corresponds to an XY cross-sectional view taken along line H-H of FIG. 15.

The film thicknesses $D_{CT\_1j}$ and $D_{CT\_2j}$ of the charge storage films CT of the memory cells MC_1j and MC_2j at the same stacking position are different between the stack structure SST1 and the stack structure SST2j. The stacking position may be defined as a relative position in the stack structure and may be represented by the number of layers of the conductive layer 102 counted from the bit line BL side in the stack structures SST1 and SST2j. The speed of the write operation of the memory cell MC_1j and the speed of the write operation of the memory cell MC_2j are different from each other in accordance with the difference in the film thicknesses $D_{CT\_1j}$ and $D_{CT\_2j}$. Furthermore, the data retention characteristic of the memory cell MC_1j and the data retention characteristic of the memory cell MC_2j are different from each other in accordance with the difference between the film thicknesses $D_{CT\_1j}$ and $D_{CT\_2j}$. That is, the memory cell array 11_1 and the memory cell array 11_2i may implement different functions regarding the write operation speed and the read data reliability, making it possible to utilize the memory cell array 11_1j and the memory cell array 11_2j selectively for each application.

For example, at the same stacking position between the stack structure SST1 and the stack structure SST2j, the film thickness $D_{CT\_1j}$ of the charge storage film CT of the memory cell MC_1j is smaller than the film thickness $D_{CT\_2j}$ of the charge storage film CT of the memory cell MC_2j. As an example, at the stacking position of the second layer from the bit line BL side in the stack structures SST1 and SST2j, the memory cells MC_1j and MC_2j are formed at the intersection positions of the conductive layer 102_w5 with columnar bodies CL_1j and CL_2j. Although the diameters $D_{CL\_1j}$ and $D_{CL\_2j}$ of the columnar bodies CL_1j and CL_2j are substantially equal, the film thickness $D_{CT\_1j}$ of the charge storage film CT of the memory cell MC_1j is smaller than the film thickness $D_{CT\_2j}$ of the charge storage film CT of the memory cell MC_2j. The diameter $D_{CR\_1j}$ of the insulating film CR of the memory cell MC_1j is larger than the diameter $D_{CR\_2j}$ of the insulating film CR of the memory cell MC_2j. Film thicknesses of films other than the charge storage film CT and the insulating film CR are substantially equal between the memory cell MC_1j and the memory cell MC_2j. In the case of FIGS. 16A and 16B, the following Formulas 3 to 9 are satisfied.

$$D_{CL\_1j} \approx D_{CL\_2j} \quad \text{Formula 3}$$

$$D_{CT\_1j} < D_{CT\_2j} \quad \text{Formula 4}$$

$$D_{CR\_1j} > D_{CR\_2j} \quad \text{Formula 5}$$

$$D_{CH\_1j} \approx D_{CH\_2j} \quad \text{Formula 6}$$

$$D_{TNL\_1j} \approx D_{TNL\_2j} \quad \text{Formula 7}$$

$$D_{BLK1\_1j} \approx D_{BLK1\_2j} \quad \text{Formula 8}$$

$$D_{BLK2\_1j} \approx D_{BLK2\_2j} \quad \text{Formula 9}$$

$D_{CH\_1j}$ and $D_{CH\_2j}$ in Formula 6 each represent the film thickness of the semiconductor film CH in the memory cells MC_1j and MC_2j, respectively. $D_{TNL\_1j}$ and $D_{TNL\_2j}$ in Formula 7 each represent the film thickness of the insulating film TNL in the memory cells MC_1j and MC_2j, respectively. $D_{BLK1\_1j}$ and $D_{BLK1\_2j}$ in Formula 8 each represent the film thickness of the insulating film BLK1 in the memory cells MC_1j and MC_2j, respectively. $D_{BLK2\_1j}$ and $D_{BLK2\_2j}$ in Formula 9 each represent the film thickness of the insulating film BLK2 in the memory cells MC_1j and MC_2j, respectively.

Note that relationships similar to those in Formulas 3 to 9 are satisfied for other stacking positions in the stack structures SST1 and SST2j. For example, at the stacking position of the eighth layer from the bit line BL side in the stack structures SST1 and SST2j, relationships similar to those in Formulas 3 to 9 are satisfied between the memory cells MC_1j and MC_2j formed at the intersection positions of the conductive layer 102_w0 with the columnar bodies CL_1j and CL_2j.

In accordance with the relationship indicated in Formula 4, the memory cell MC_1j may suppress the variation in the threshold voltage at the time of writing to achieve a high-speed write operation, and the memory cell MC_2j may increase the variation in the threshold voltage at the time of writing to achieve low-speed write operation. Furthermore, in accordance with the relationship represented by Formula 4, the memory cell MC_1j may degrade the data retention characteristics with the shortened tunnel distance and the heightened electric field intensity, and the memory cell MC_2j may improve the data retention characteristics with the increased tunnel distance and the lowered electric field intensity. The tunnel distance is a distance by which the charge tunnels from the semiconductor film CH through the insulating film TNL to reach the charge storage film CT at the time of writing. That is, in the write operation and the read operation, the memory cell array 11_1j may implement a high-speed write operation and a low-reliability read operation, while the memory cell array 11_2j may implement a low-speed write operation and a high-reliability read operation.

Note that the film thicknesses $D_{CT\_1j}$ and $D_{CT\_2j}$ of the charge storage film CT are desirably different by 10% or more between the memory cell MC_1j and the memory cell MC_2j corresponding to the same stacking position in the stack structures SST1 and SST2j. For example, in a case where the film thickness $D_{CT\_1j}$ of the charge storage film CT of the memory cell MC_1j is smaller than the film thickness $D_{CT\_2j}$ of the charge storage film CT of the memory cell MC_2j at the same stacking position in the stack structures SST1 and SST2j, it is desirable to satisfy the following Formula 10.

$$D_{CT\_2j}/D_{CT\_1j} \geq 1.1 \qquad \text{Formula 10}$$

By satisfying Formula 10, a significant difference in performance may be obtained between the memory cell array 11_1j and the memory cell array 11_2j.

Alternatively, it is desirable that maximum film thicknesses Max_$D_{CT\_1j}$ and Max_$D_{CT\_2j}$ of the charge storage film CT differ by 10% or more between the memory cell arrays 11_1j and 11_2j, regardless of the stacking position in the stack structures SST1 and SST2j. The maximum film thickness Max_$D_{CT\_1j}$ is the maximum film thickness out of the film thicknesses of the charge storage films CT of the plural memory cells MC_1j included in the memory cell array 11_1j. The maximum film thickness Max_$D_{CT\_2j}$ is the maximum film thickness out of the film thicknesses of the charge storage films CT of the plural memory cells MC_1j included in the memory cell array 11_2j. For example, in a case where the film thickness $D_{CT\_1j}$ of the charge storage film CT of the memory cell MC_1j is smaller than the film thickness $D_{CT\_2j}$ of the charge storage film CT of the memory cell MC_2j at the same stacking position in the stack structures SST1 and SST2j, it is desirable to satisfy the following Formula 11.

$$\text{Max\_}D_{CT\_2j}/\text{Max\_}D_{CT\_1j} \geq 1.1 \qquad \text{Formula 11}$$

By satisfying Formula 11, a significant difference in performance may be obtained between the memory cell array 11_1j and the memory cell array 11_2j.

Alternatively, although not illustrated, at substantially the same stacking position between the stack structure SST1 and the stack structure SST2j, the film thickness $D_{CT\_1j}$ of the charge storage film CT of the memory cell MC_1j may be larger than the film thickness $D_{CT\_2j}$ of the charge storage film CT of the memory cell MC_2j. Accordingly, the memory cell MC_1j may increase the variation in the threshold voltage at the time of writing to achieve a low-speed write operation, and the memory cell MC_2j may suppress the variation in the threshold voltage at the time of writing to achieve a high-speed write operation. Furthermore, the memory cell MC_1j may improve the data retention characteristics with the increased tunnel distance and the lowered electric field intensity, and the memory cell MC_2j may degrade the data retention characteristics with the decreased tunnel distance and the heightened electric field intensity. That is, in the write operation and the read operation, the memory cell array 11_1j may implement a low-speed write operation and a high-reliability read operation, while the memory cell array 11_2j may implement a high-speed write operation and a low-reliability read operation.

As described above, in the third embodiment, in the semiconductor memory device 1j, the film thicknesses $D_{CT\_1j}$ and $D_{CT\_2j}$ of the charge storage films CT of the memory cells MC_1j and MC_2j at substantially the same stacking position are different from each other between the stack structure SST1 and the stack structure SST2j. The speed of the write operation of the memory cell MC_1j and the speed of the write operation of the memory cell MC_2j are different from each other in accordance with the difference in the film thicknesses $D_{CT\_1j}$ and $D_{CT\_2j}$. Furthermore, the data retention characteristic of the memory cell MC_1j and the data retention characteristic of the memory cell MC_2j are different from each other in accordance with the difference between the film thicknesses $D_{CT\_1j}$ and $D_{CT\_2j}$. That is, the memory cell array 11_1 and the memory cell array 11_2i may implement different functions regarding the write operation speed and the read data reliability, making it possible to utilize the memory cell array 11_1j and the memory cell array 11_2j selectively for each application.

Fourth Embodiment

Next, a semiconductor memory device 1k according to a fourth embodiment will be described. In the following, portions different from the first to third embodiments will be mainly described.

The third embodiment has illustrated a structure in which the film thickness of the charge storage film CT is varied between the memory cell arrays 11. In contrast, the fourth embodiment will illustrate a structure in which the film thickness of the insulating film TNL is varied between the memory cell arrays 11.

Figure 17:
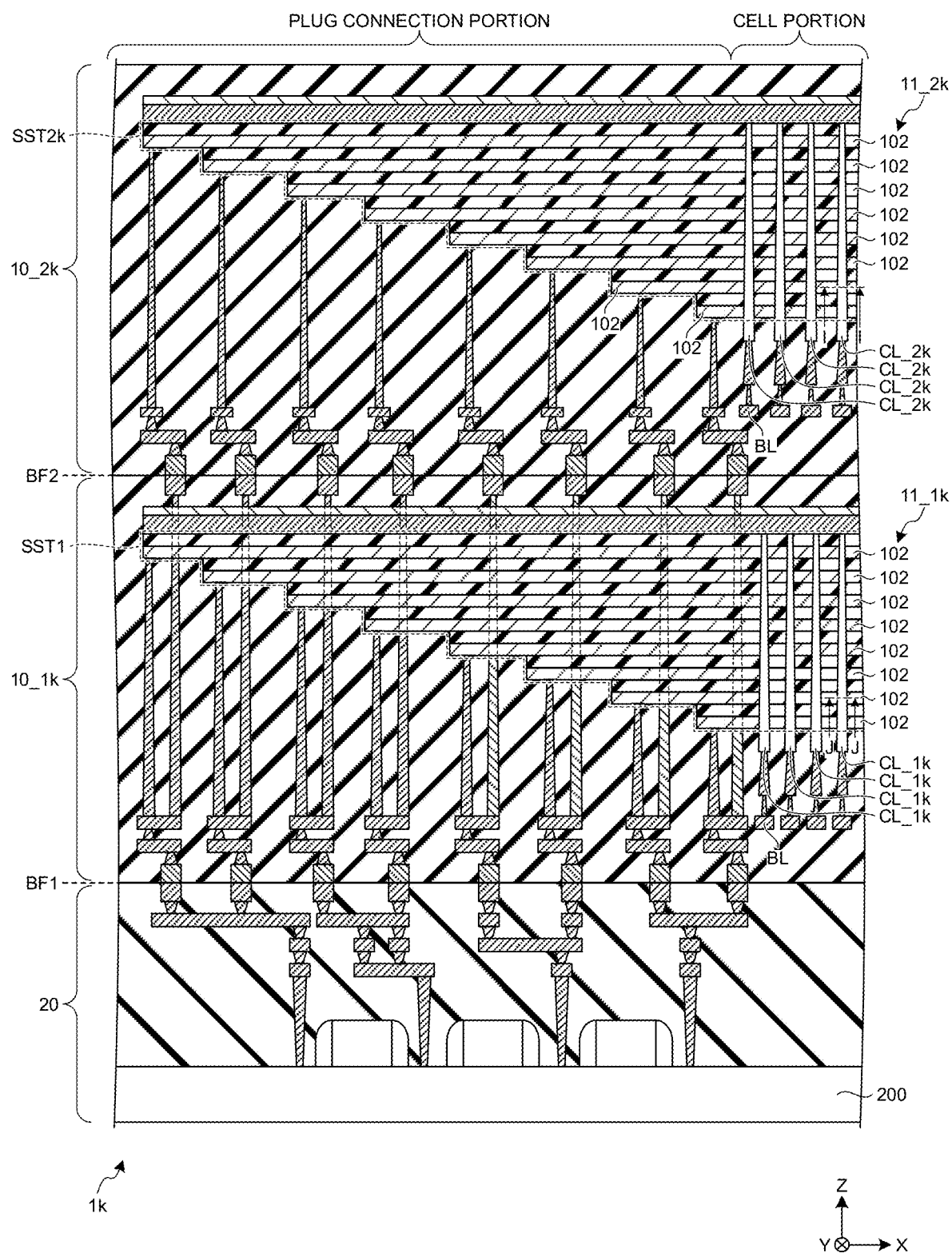
FIG. 17 is a cross-sectional view in the stack direction illustrating a configuration of a semiconductor memory device according to a fourth embodiment.
Figure 18A:
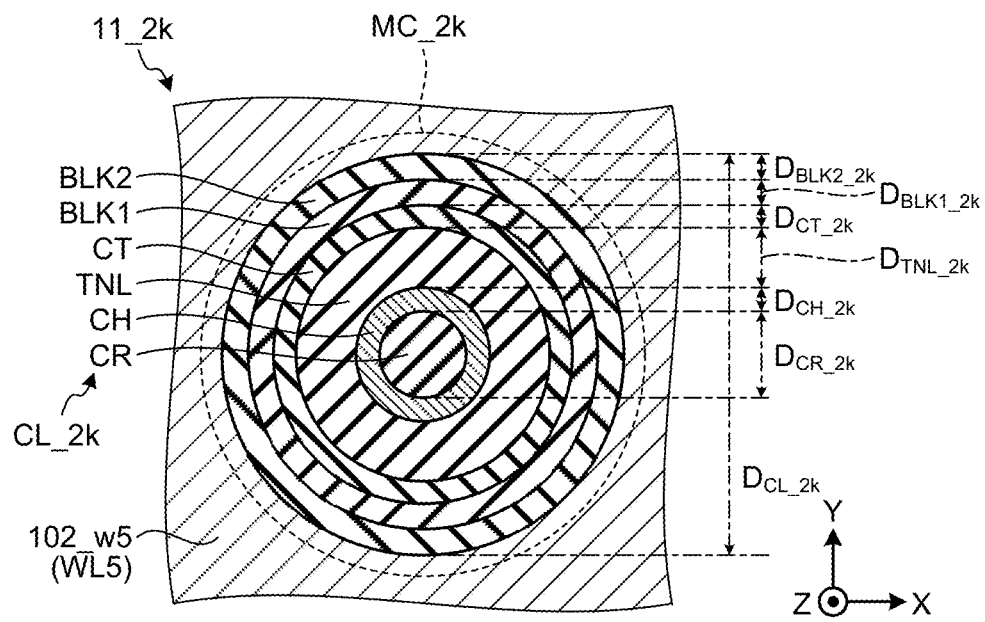
FIGS. 18A and 18B are cross-sectional views in the planar direction illustrating a configuration of a memory cell according to the fourth embodiment.
Figure 18B:
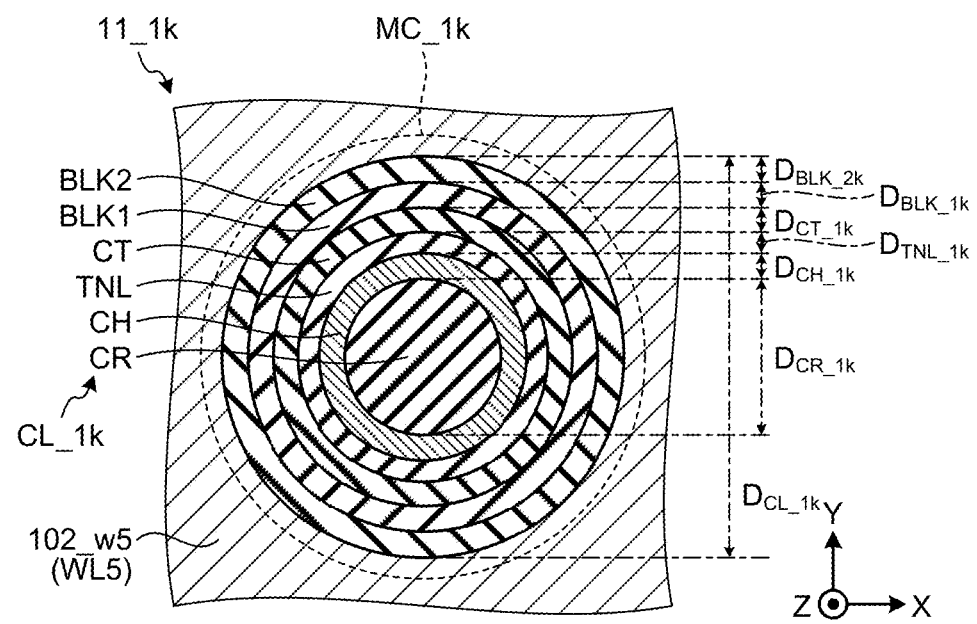

In the semiconductor memory device 1k, as illustrated in FIGS. 17, 18A, and 18B, a film thickness $D_{TNL\_1k}$ of an insulating film TNL in a memory cell MC_1k of a memory cell array 11_1k is different from a film thickness $D_{TNL\_2k}$ of an insulating film TNL in a memory cell MC_2k of a memory cell array 11_2k. FIG. 17 is an XZ cross-sectional view illustrating a configuration of the semiconductor memory device 1k. FIGS. 18A and 18B are XY cross-sectional views illustrating configurations of the memory cells MC_1k and MC_2k. FIG. 18A is an XY cross-sectional view of the memory cell MC_2k and corresponds to an XY cross-sectional view taken along line I-I in FIG. 17. FIG. 18B is an XY cross-sectional view of the memory cell MC_2k and corresponds to an XY cross-sectional view taken along line J-J in FIG. 17.

The film thicknesses $D_{TNL\_1k}$ and $D_{TNL\_2k}$ of the insulating films TNL of the memory cells MC_1k and MC_2k at the same stacking position are different from each other between the stack structure SST1 and the stack structure SST2k. The stacking position may be represented by the number of layers of the conductive layer 102 counted from the bit line BL side in the stack structures SST1 and SST2k. The speed of the write operation of the memory cell MC_1k and the speed of the write operation of the memory cell MC_2k are different from each other in accordance with the difference between the film thicknesses $D_{TNL\_1k}$ and $D_{TNL\_2k}$. Furthermore, the data retention characteristics of the memory cell MC_1k and the data retention characteristics of the memory cell MC_2k are different from each other in accordance with the difference between the film thicknesses $D_{TNL\_1k}$ and $D_{TNL\_2k}$. That is, the memory cell array 11_1 and the memory cell array 11_2i may implement different functions regarding the write operation speed and the read data reliability, making it possible to utilize the memory cell array 11_1k and the memory cell array 11_2k selectively for each application.

For example, at substantially the same stacking position in the stack structure SST1 and the stack structure SST2k, the film thickness $D_{TNL\_1k}$ of the insulating film TNL of the memory cell MC_1k is smaller than the film thickness $D_{TNL\_2k}$ of the insulating film TNL of the memory cell MC_2k. As an example, at the stacking position of the second layer from the bit line BL side in the stack structures SST1 and SST2k, the memory cells MC_1k and MC_2k are formed at the intersection positions of the conductive layer 102_w5 with columnar bodies CL_1k and CL_2k. Although the diameters $D_{CL\_1k}$ and $D_{CL\_2k}$ of the columnar bodies CL_1k and CL_2k are equal, the film thickness $D_{TNL\_1k}$ of the insulating film TNL of the memory cell MC_1k is smaller than the film thickness $D_{TNL\_2k}$ of the insulating film TNL of the memory cell MC_2k. The diameter $D_{CR\_1k}$ of the insulating film CR of the memory cell MC_1k is larger than the diameter $D_{CR\_2k}$ of the insulating film CR of the memory cell MC_2k. Film thicknesses of films other than the insulating film TNL and the insulating film CR are equal between the memory cell MC_1k and the memory cell MC_2k. In the case of FIGS. 18A and 18B, the following Formula 12 to 18 are satisfied.

$$D_{CL\_1k} \approx D_{CL\_2k} \qquad \text{Formula 12}$$

$$D_{TNL\_1k} < D_{TNL\_2k} \qquad \text{Formula 13}$$

$$D_{CR\_1k} > D_{CR\_2k} \qquad \text{Formula 14}$$

$$DC_{H\_1k} \approx D_{CH\_2k} \qquad \text{Formula 15}$$

$$D_{CT\_1k} \approx D_{CT\_2k} \qquad \text{Formula 16}$$

$$D_{BLK1\_1k} \approx D_{BLK1\_2k} \qquad \text{Formula 17}$$

$$D_{BLK2\_1k} \approx D_{BLK2\_2k} \qquad \text{Formula 18}$$

$D_{CH\_1k}$ and $D_{CH\_2k}$ in Formula 15 each represent the film thickness of the semiconductor film CH of the memory cells MC_1k and MC_2k, respectively. $D_{CT\_1k}$ and $D_{CT\_2k}$ in Formula 16 each represent the film thickness of the charge storage film CT of the memory cells MC_1k and MC_2k, respectively. $D_{BLK1\_1k}$ and $D_{BLK1\_2k}$ in Formula 17 each represent the film thickness of the insulating films BLK1 of the memory cells MC_1k and MC_2k, respectively. $D_{BLK2\_1k}$ and $D_{BLK2\_2k}$ in Formula 18 each represent the film thickness of the insulating film BLK2 of the memory cells MC_1k and MC_2k, respectively.

Note that relationships similar to those in Formulas 12 to 18 are satisfied for other stacking positions in the stack structures SST1 and SST2k. For example, at the stacking position of the eighth layer from the bit line BL side in the stack structures SST1 and SST2k, relationships similar to those in Formulas 12 to 18 are satisfied between the memory cells MC_1k and MC_2k formed at the intersection positions of the conductive layer 102_w0 with the columnar bodies CL_1k and CL_2k.

According to the relationship indicated in Formula 13, the memory cell MC_1k can suppress the variation in the threshold voltage at the time of writing to achieve a high-speed write operation, and the memory cell MC_2k may increase the variation in the threshold voltage at the time of writing to achieve a low-speed write operation. Furthermore, according to the relationship represented by Formula 13, the memory cell MC_1k may degrade the data retention characteristics with the shortened tunnel distance and the heightened electric field intensity, and the memory cell MC_2k may improve the data retention characteristics with the increased tunnel distance and the lowered electric field intensity. The tunnel distance is a distance by which charges tunnel from the semiconductor film CH through the insulating film TNL to reach the insulating film TNL at the time of writing. That is, in the write operation and the read operation, the memory cell array 11_1k may implement a high-speed write operation and a low-reliability read operation, while the memory cell array 11_2k may implement a low-speed write operation and a high-reliability read operation.

Note that the film thicknesses $D_{TNL\_1k}$ and $D_{TNL\_2k}$ of the insulating films TNL are desirably different by 10% or more between the memory cell MC_1k and the memory cell MC_2k corresponding to substantially the same stacking position in the stack structures SST1 and SST2k. For example, in a case where the film thickness $D_{TNL\_1k}$ of the insulating film TNL of the memory cell MC_1k is smaller than the film thickness $D_{TNL\_2k}$ of the insulating film TNL of the memory cell MC_2k at substantially the same stacking position in the stack structures SST1 and SST2k, it is desirable to satisfy the following Formula 19.

$$D_{TNL\_2k}/D_{TNL\_1k} \geq 1.1 \qquad \text{Formula 19}$$

By satisfying Formula 19, a significant difference in performance may be obtained between the memory cell array 11_1k and the memory cell array 11_2k.

Alternatively, it is desirable that maximum film thicknesses $\text{Max}\_D_{TNL\_1k}$ and $\text{Max}\_D_{TNL\_2k}$ of the insulating films TNL are different from each other by 10% or more between the memory cell arrays 11_1k and 11_2k regardless of the stacking positions in the stack structures SST1 and SST2k. The maximum film thickness $\text{Max}\_D_{TNL\_1k}$ is the maximum film thickness out of the film thicknesses of the insulating films TNL of the plural memory cells MC_1k included in the memory cell array 11_1k. The maximum film thickness $\text{Max}\_D_{TNL\_2k}$ is the maximum film thickness out of the film thicknesses of the insulating films TNL of the plural memory cells MC_1k included in the memory cell array 11_2k. For example, in a case where the film thickness $D_{TNL\_1k}$ of the insulating film TNL of the memory cell MC_1k is smaller than the film thickness $D_{TNL\_2k}$ of the insulating film TNL of the memory cell MC_2k at the same stacking position in the stack structures SST1 and SST2k, it is desirable to satisfy the following Formula 20.

$$\text{Max}\_D_{TNL\_2k}/\text{Max}\_D_{TNL\_1k} \geq 1.1 \qquad \text{Formula 20}$$

By satisfying Formula 20, a significant difference in performance may be obtained between the memory cell array 11_1k and the memory cell array 11_2k.

Alternatively, although not illustrated, at substantially the same stacking position in the stack structure SST1 and the stack structure SST2k, the film thickness $D_{TNL\_1k}$ of the insulating film TNL of the memory cell MC_1k may be set larger than the film thickness $D_{TNL\_2k}$ of the insulating film TNL of the memory cell MC_2k. Accordingly, the memory cell MC_1k can increase the variation in the threshold voltage at the time of writing to achieve a low-speed write operation, and the memory cell MC_2k may suppress the variation in the threshold voltage at the time of writing to achieve a high-speed write operation. Furthermore, the memory cell MC_1k may improve the data retention characteristics with the increased tunnel distance and the lowered electric field intensity, and the memory cell MC_2k may degrade the data retention characteristics with the decreased tunnel distance and the heightened electric field intensity. That is, in the write operation and the read operation, the memory cell array 11_1k may implement a low-speed write operation and a high-reliability read operation, while the memory cell array 11_2k may implement a high-speed write operation and a low-reliability read operation.

As described above, in the fourth embodiment, in the semiconductor memory device 1k, the film thicknesses $D_{TNL\_1k}$ and $D_{TNL\_2k}$ of the insulating films TNL of the memory cells MC_1k and MC_2k at substantially the same stacking positions are different from each other between the stack structure SST1 and the stack structure SST2k. The speed of the write operation of the memory cell MC_1k and the speed of the write operation of the memory cell MC_2k are different from each other in accordance with the difference between the film thicknesses $D_{TNL\_1k}$ and $D_{TNL\_2k}$. Furthermore, the data retention characteristics of the memory cell MC_1k and the data retention characteristics of the memory cell MC_2k are different from each other in accordance with the difference between the film thicknesses $D_{TNL\_1k}$ and $D_{TNL\_2k}$. That is, the memory cell array 11_1 and the memory cell array 11_2i may implement different functions regarding the write operation speed and the read data reliability, making it possible to utilize the memory cell array 11_1k and the memory cell array 11_2k selectively for each application.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a first chip;
    a second chip bonded to the first chip; and
    a third chip bonded to the second chip on a side opposite to the first chip,
    wherein the first chip includes:
    plural first conductive layers stacked via a first insulating layer;
    a first semiconductor film extending in a stack direction through the plural first conductive layers;
    a first insulating film disposed between the plural first conductive layers and the first semiconductor film; and
    a first charge storage film disposed between the first insulating film and the first semiconductor film,
    the second chip includes:
    plural second conductive layers stacked via a second insulating layer;
    a second semiconductor film extending in the stack direction through the plural second conductive layers;
    a second insulating film disposed between the plural second conductive layers and the second semiconductor film; and
    a second charge storage film disposed between the second insulating film and the second semiconductor film, and
    a film thickness of the first charge storage film and a film thickness of the second charge storage film are different from each other in a direction intersecting the stack direction.

2. The semiconductor memory device according to claim 1,
    wherein the film thickness of the first charge storage film is smaller than the film thickness of the second charge storage film.

3. The semiconductor memory device according to claim 1,
    wherein the film thickness of the first charge storage film is greater than the film thickness of the second charge storage film.

4. The semiconductor memory device according to claim 1,
    wherein the film thickness of the first insulating film and the film thickness of the second insulating film are substantially equal to each other in the direction intersecting the stack direction.

5. The semiconductor memory device according to claim 1,
    wherein the film thickness of the first semiconductor film and the film thickness of the second semiconductor film are substantially equal to each other in the direction intersecting the stack direction.

6. A semiconductor memory device comprising:
    a first chip;
    a second chip bonded to the first chip;
    a third chip bonded to the second chip on a side opposite to the first chip,
    wherein the first chip includes:
    plural first conductive layers stacked via a first insulating layer;
    a first semiconductor film extending in a stack direction through the plural first conductive layers;
    a first insulating film disposed between the plural first conductive layers and the first semiconductor film;
    a first charge storage film disposed between the first insulating film and the first semiconductor film; and
    a third insulating film disposed between the first charge storage film and the first semiconductor film,
    the second chip includes:
    plural second conductive layers stacked via a second insulating layer;
    a second semiconductor film extending in the stack direction through the plural second conductive layers;
    a second insulating film disposed between the plural second conductive layers and the second semiconductor film;
    a second charge storage film disposed between the second insulating film and the second semiconductor film; and
    a fourth insulating film disposed between the second charge storage film and the second semiconductor film, and
    a film thickness of the third insulating film and a film thickness of the fourth insulating film are different from each other in a direction intersecting the stack direction.

7. The semiconductor memory device according to claim 6,
    wherein the film thickness of the third insulating film is smaller than the film thickness of the fourth insulating film.

8. The semiconductor memory device according to claim 6,
wherein the film thickness of the third insulating film is greater than the film thickness of the fourth insulating film.

9. The semiconductor memory device according to claim 6,
wherein the film thickness of the first charge storage film and the film thickness of the second charge storage film are substantially equal to each other in the direction intersecting the stack direction.

10. The semiconductor memory device according to claim 6,
wherein the film thickness of the first semiconductor film and the film thickness of the second semiconductor film are substantially equal to each other in the direction intersecting the stack direction.

* * * * *